United States Patent [19]

Davies et al.

[11] Patent Number: 4,857,831
[45] Date of Patent: Aug. 15, 1989

[54] BOREHOLE CASING DIAGNOSTIC APPARATUS AND METHOD

[75] Inventors: Dylan H. Davies, Tokyo; Jiro Takeda, Yokohama, both of Japan

[73] Assignee: Schlumberger Technology Corporation, New York, N.Y.

[21] Appl. No.: 947,314

[22] Filed: Dec. 29, 1986

[51] Int. Cl.$^4$ ............................................. G01R 27/00
[52] U.S. Cl. ............................... 324/65 CR; 324/65 P
[58] Field of Search .............. 324/65 R, 65 P, 65 CR, 324/64, 71.2, 347–349, 351, 368, 366, 367; 204/404, 1 C; 330/85

[56] References Cited

U.S. PATENT DOCUMENTS

| | | | |
|---|---|---|---|
| 2,371,658 | 3/1945 | Stewart | 175/182 |
| 2,459,196 | 1/1949 | Stewart | 175/182 |
| 2,553,350 | 3/1951 | Bayhi | 175/183 |
| 3,167,707 | 1/1965 | Oliver | 324/347 |
| 3,548,362 | 12/1970 | Blank | 339/95 |
| 3,801,924 | 4/1974 | Mueller et al. | 330/85 X |
| 4,179,652 | 12/1979 | Davis | 324/64 |
| 4,335,350 | 6/1982 | Chen | 324/65 P |
| 4,431,963 | 2/1984 | Walkow | 324/65 R |
| 4,431,964 | 2/1984 | Walkow | 324/65 R |
| 4,468,623 | 8/1984 | Gianzero et al. | 324/367 |
| 4,588,951 | 5/1986 | Ohmer | 324/367 |

OTHER PUBLICATIONS

Aguilar, J. R., "Redisenan Medidor de Potencial," *Petroleo Int.* Jan. 1976, pp. 33–36.

Aguilar, J. R., "Diseno y Aplicacion de un Dispositivo de Registro de Potencial Diferencial Para Estudio de Fugas de Corriente o Interferencia Exterior en Tuberias de Revestimiento en Pozos Petroleros," *Ingenieria Petrolera*, Apr. 1975, pp. 159–171.

Kirklen, C. A., "Evaluation and Design Considerations for Cathodic Protection of Well Casings", Proceedings of 17th Annual Appalachian Underground Corrosion Short Course, *Engineering Experiment Station Bulletin*, No. 106, 1972, pp. 545–554.

Kilpatrick, J. M., "Use of the Casing Potential Profile Test for Well Casing Interference Studies," Paper Presented at Spring Meeting of Southwestern District, API Division of Production, Mar. 1967, pp. 34–39.

"Resistivity Logs", Schlumberger Log Interpretation Principles/Applications, Schlumberger Educational Services, 1987, pp. 69–94.

Primary Examiner—Reinhard J. Eisenzopf
Assistant Examiner—Jack B. Harvey
Attorney, Agent, or Firm—David P. Gordon; Peter Y. Lee; Keith G. W. Smith

[57] ABSTRACT

Apparatus and method for investigating a borehole casing. The preferred apparatus generally comprises: a housing which is connected to a cable; sets of electrodes, each set being axially spaced from another set, with the electrodes in each set being circumferentially spaced at an axial depth; a positioning device provided in the housing for bringing the electrodes into contact with the casing; a measuring circuit provided inside of the housing and electrically connected to the electrodes for measuring at least the potential difference of the casing between the electrode locations, wherein the potential difference information is amplified by the measuring circuit, and the amplified information is transmitted through the cable for processing; and a control circuit provided in the housing for controlling the operation of the positioning device and the measuring circuit. Preferably, a digitizing circuit is provided so that the amplified information is digitized before it is transmitted to the surface and processed.

28 Claims, 19 Drawing Sheets

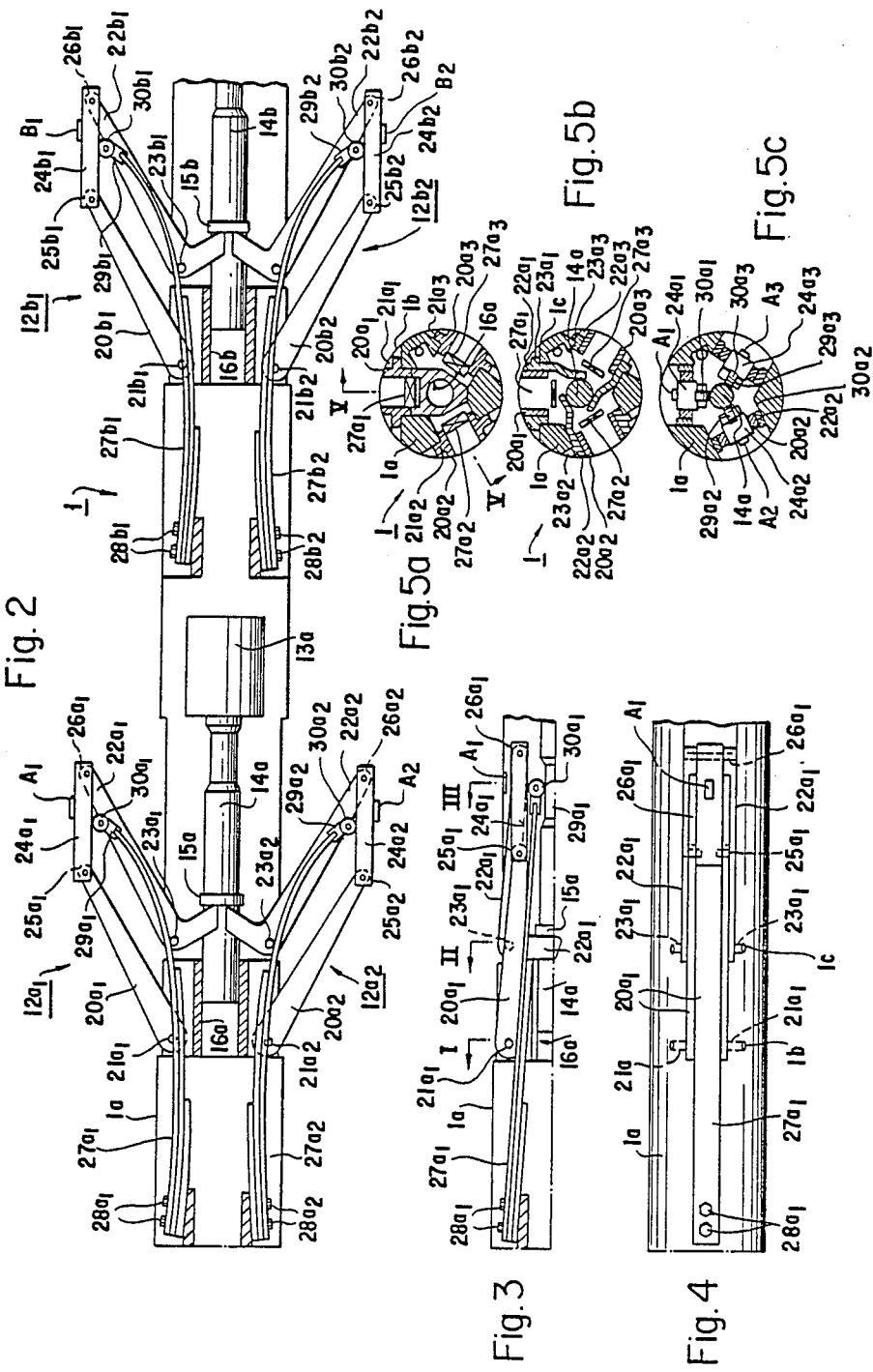

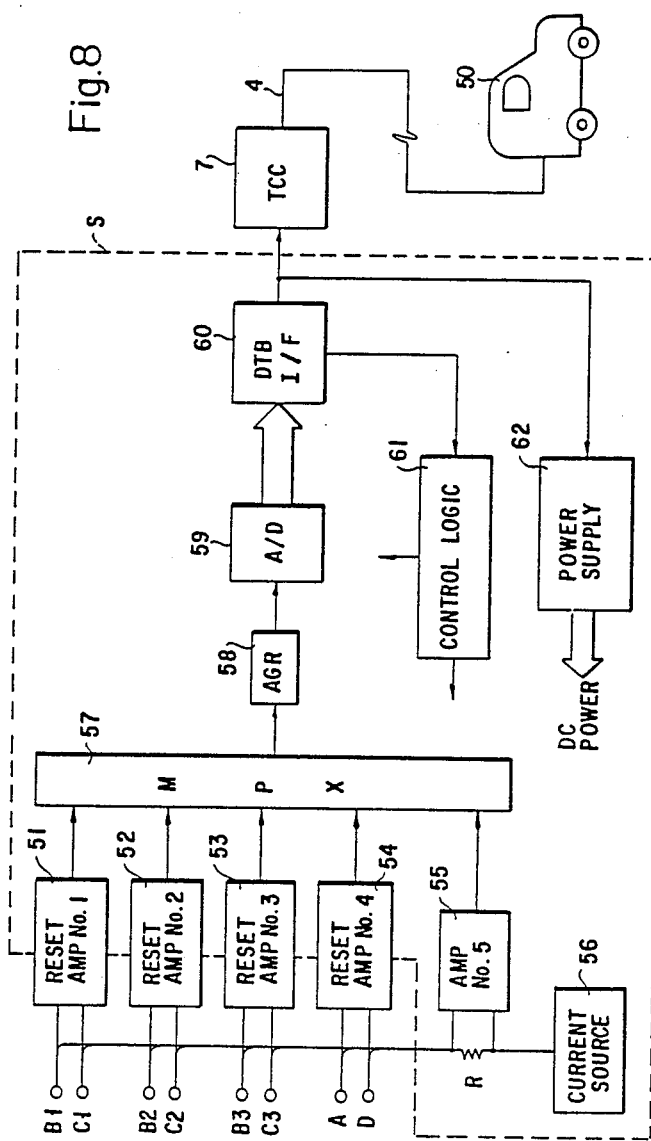

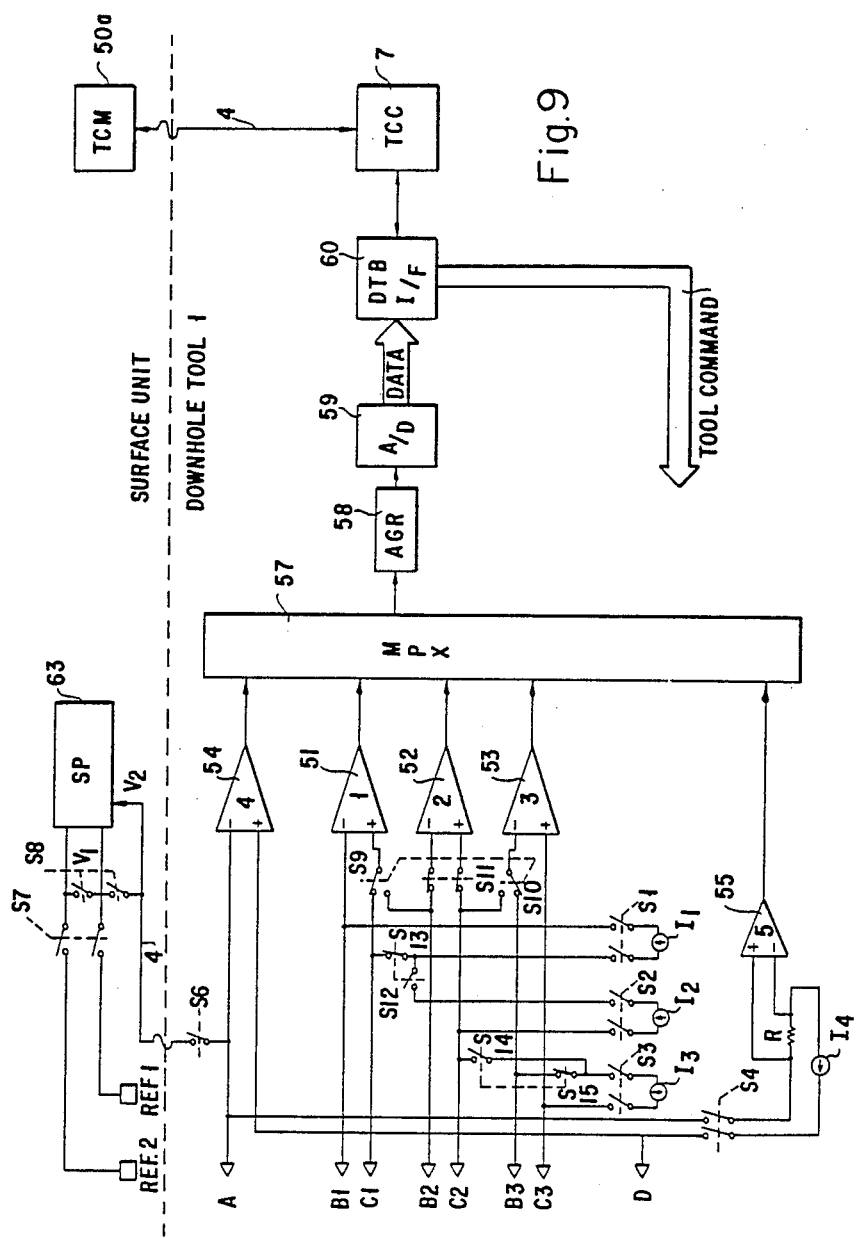

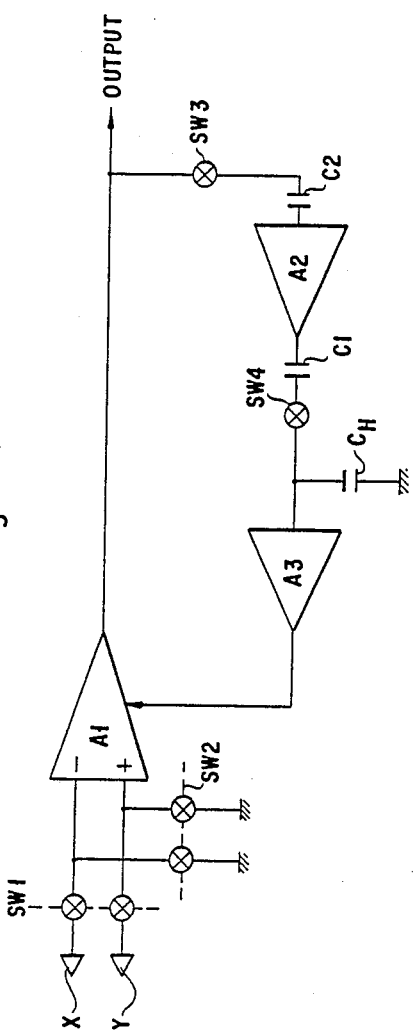

ISOLATED CHOPPER AMPLIFIER

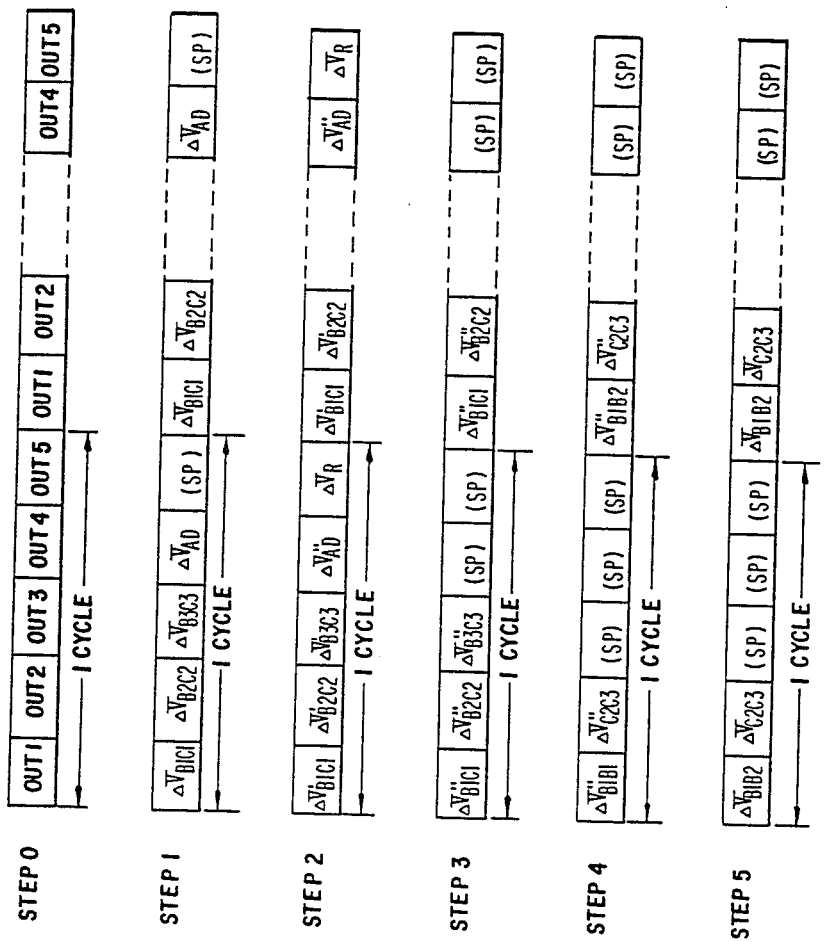

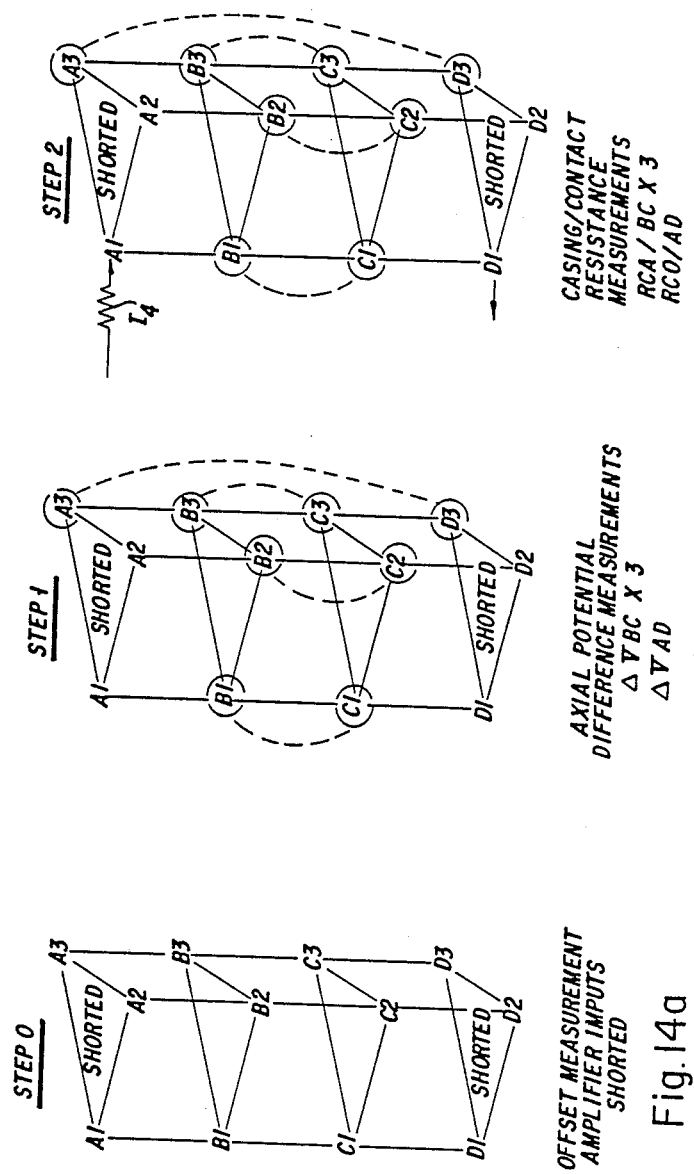

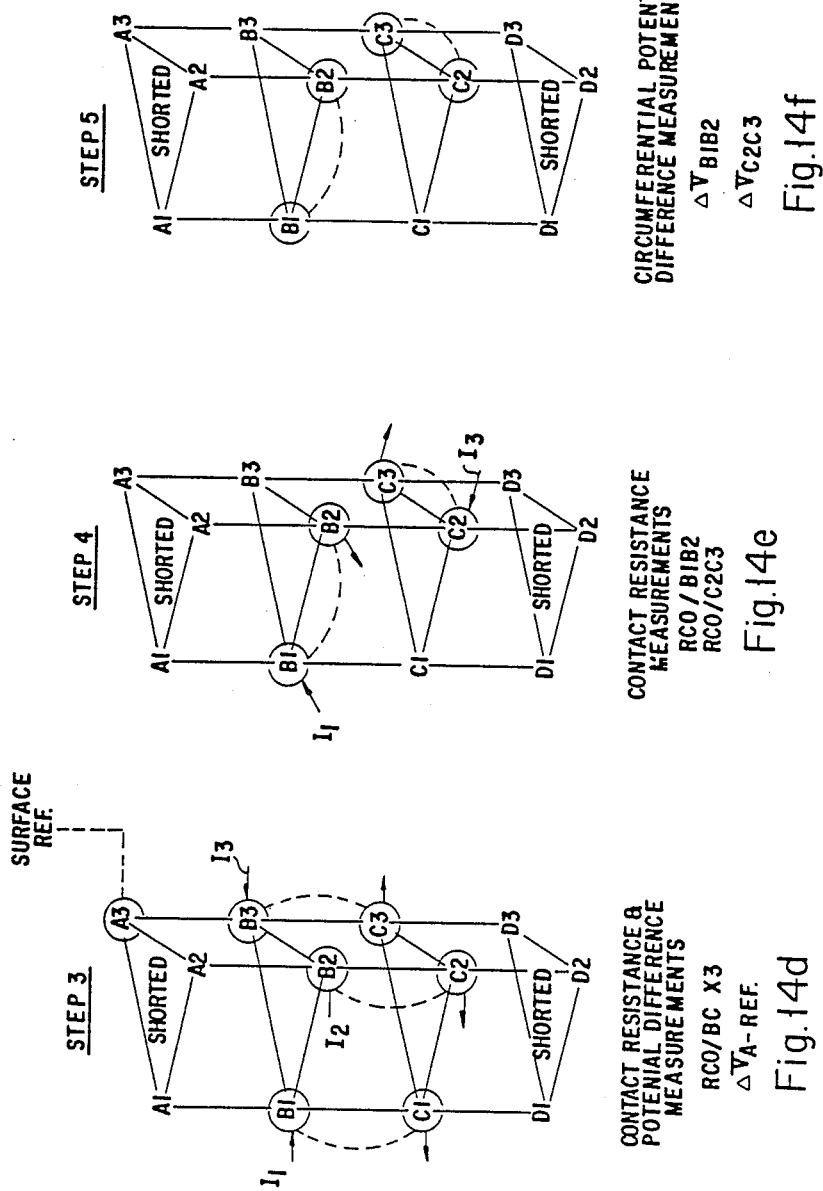

AXIAL
POTENTIAL DIFF.
MEASUREMENTS

AXIAL
POTENTIAL DIFF.
MEASUREMENTS

CIRCUMF.
POTENTIAL DIFF.
MEASUREMENTS

CASING RESISTANCE
MEASUREMENTS

CASING RESISTANCE
MEASUREMENTS

CASING RESISTANCE
MEASUREMENTS

BOREHOLE CASING DIAGNOSTIC APPARATUS AND METHOD

BACKGROUND

1. Field of the Invention

The present invention generally relates to an apparatus and method for diagnosing the electrical condition of an elongated casing, such as a metal pipe. More specifically, the present invention relates to borehole casing diagnostic apparatuses and methods which are suitable for evaluating cathodic protection of casings and for providing local corrosion rate measurements for casings which are fitted into boreholes traversing earth formations.

2. Prior Art

When a metal pipe or casing is fitted into a borehole, the metal will be liable to corrode as the fluids present in the borehole are potentially corrosive. Because an earth formation may include several layers, large scale electrochemical cells can be set up between the parts of the casing contacting the different layers, so that in some regions, net current enters the casing from the formation while in other regions net current leaves the casing and flows into the formation. When net current in the form of metal ions leaves the casing, the casing will corrode gradually. It is known that the rate of such corrosion can be in the order of mm/year, which is proportional to an outgoing current on the order of microamps/cm$^2$. Since this electrochemical corrosion results from the current leaving the casing, the corrosion can be prevented if the casing is maintained at a potential such that net current enters the casing over its entire length. For this purpose, cathodic protection is often used. Cathodic protection is well known in the art, and prevents the electrochemical corrosion of a metal casing fitted in a borehole traversing an earth formation by transforming the metal casing into the cathode of an electrochemical cell.

In order to determine whether cathodic protection is needed for a casing, and in evaluating and/or optimizing the cathodic protection applied to a particular casing, the potential profile of the casing along its longitudinal direction is measured. In such a case, typically, a downhole apparatus which is provided with a plurality of electrodes is lowered into the casing. The downhole apparatus is suspended by a long cable which is connected to a measurement unit located at the ground surface, and measurements such as potential difference measurements are taken by the measurement unit at the ground surface as the downhole apparatus traverses the length of the casing. With such an arrangement, since the information of a potential difference between any two of the electrodes in contact with the casing must be transmitted to the measurement unit at the ground surface through the long cable connecting the downhole apparatus to the measurement unit, the information tends to be degraded due to noise pick-up and crosstalk, among other reasons. In addition, the information is also adversely affected by thermal EMFs along the long cable and at the electrical connections on the surface and in the downhole tool. In order to eliminate the effects of the cable as much as possible, and in particular to eliminate the thermal EMF effects, it has been proposed in U.S. Ser. No. 925,035, filed Oct. 30, 1986, which is assigned to the assignee herein and hereby incorporated herein by reference, to incorporate a relay switch in the downhole apparatus for subtracting the effects of the cable as described. While the proposed technique significantly improves the quality of data collected and the potential difference determinations, it still necessitates the carrying out of measurements through the long cable since the measurement unit is located at the ground surface. As long as measurements are carried out at the ground surface, measurement times will be long due to the need to average or integrate data because of crosstalk and noise problems which occur when remote measurements are made through long cables.

As set forth above, in order to carry out potential difference measurements along the longitudinal axis of a casing, the downhole apparatus is typically provided with a plurality of longitudinally spaced electrodes. Accordingly, it is either assumed that there is no appreciable potential difference or current in the circumferential direction or such effects are simply neglected. While U.S. Pat. No. 3,207,981 issued to Marsh et al. on September 21, 1965 discloses a downhole apparatus including a plurality of electrodes which are disposed circumferentially, it only measures artificially induced circumferential potentials and neglects the potential difference or current components in the longitudinal direction. Thus, none of the prior art techniques sufficiently guarantee the reliability of the electrical property data taken since they only provide for the making of measurements either in the longitudinal direction alone or in the circumferential direction alone while the potential difference or current may have components both in the longitudinal and circumferential directions.

SUMMARY OF THE INVENTION

It is therefore a primary object of the present invention to obviate the disadvantages of the prior art as described above and to provide an improved apparatus and method for diagnosing a casing, such as a borehole casing.

Another object of the present invention is to provide an improved casing diagnostic apparatus which may investigate a casing such as a borehole casing, and which includes a measurement unit disposed therein for locally and directly carrying out downhole measurements.

A further object of the present invention is to provide an improved casing diagnostic apparatus capable of carrying out measurements of predetermined electrical properties of the casing, in which the apparatus is fitted with electrodes for investigating the casing in both its longitudinal and circumferential directions.

A still further object of the present invention is to provide an improved casing diagnostic downhole apparatus capable of speedily and accurately determining the local corrosion rate of the casing.

Yet a further object of the present invention is to provide an improved casing diagnostic downhole apparatus capable of carrying out fine electrical measurements while submerged in well liquids of relatively high electrical conductivity, such as brine.

In accordance with one aspect of the present invention, there is provided a casing diagnostic downhole apparatus, generally in the shape of a torpedo, which is capable of investigating the casing along the length and circumference of the casing and which directly measures a predetermined local electrical property of the casing, such as an electrical impedance or casing resistance between two points on the casing. In order to allow such direct measurements, the casing diagnostic downhole apparatus incorporates a measurement unit which typically includes an amplifier circuit and an analog-to-digital converter. The downhole apparatus also includes a plurality of electrodes which are mounted on a housing so as to be movable with respect thereto between a retracted position where the electrodes are received in a predefined space in the housing and an advanced position where the electrodes are forced into contact with the casing. The measurement unit inside of the downhole apparatus is connected to the provided electrodes through switch means and the unit may take measurements of at least one predetermined electrical property between any selected two of the electrodes in contact with the casing. After converting the measured values into digital data, the measurement unit transmits the digital data via a cable to a surface processing system which preferably includes a computer.

In accordance with a first aspect of the present invention summarized above, since measurements of a desired local electrical property between two points on the casing are carried out directly and locally and the measured data are transmitted to the surface processing unit through the long cable in the form of digital data, the problem of crosstalk is completely eliminated while taking measurements. Since the long cable is used as a data transmission line rather than interconnection lines for a measurement unit, measurements are not adversely affected even if thermal EMFs along the cable are drifting quickly or fluctuating. Indeed, they are not adversely affected even if potential differences along the cable are large compared with the signal to be measured, e.g., the potential difference between two points on the casing. Likewise, noise immunity is also enhanced significantly where data transmissions between the downhole apparatus and the surface processing unit are carried out digitally. As set forth above, since crosstalk is no longer a problem in the present invention, measurements can be taken in parallel in the case where two or more pairs of electrodes are provided. Furthermore, as cable noise and drift is not a problem, individual measurements can be taken in shorter time with less averaging or integration steps. This is particularly true for casing resistance measurements where crosstalk problems are severe.

In accord with a further aspect of the present invention, the amplifier circuit of the measurement unit provided in the downhole apparatus has a two-stage structure, each stage including a reset stabilized operational amplifier which includes a main d.c. amplifier and a negative feedback loop for automatically cancelling large amplifier offset voltages of the main d.c. amplifier. The feedback loop includes sampling means for sampling an offset voltage of the main d.c. amplifier and holding means for temporarily holding the offset voltage thus sampled, which is then supplied as an input to the main d.c. amplifier for subtraction. Preferably, the holding means includes a capacitor connected between the feedback loop and a reference potential, normally ground, and the sampling means includes a switch and an a.c. offset amplifier connected in series in the feedback loop between the output of the main d.c. amplifier and the holding capacitor. The feedback loop also preferably includes at least one capacitor connected in series with the a.c. offset amplifier. Preferably, the measurement unit also includes at least one current source for supplying a predetermined current between two selected electrodes thereby permitting the contact resistance between the electrodes and the casing to be measured. The contact resistance information may then be advantageously used as a quality control for the obtained data as described in Serial No. 925,035.

In accordance with another aspect of the present invention, a casing diagnostic downhole apparatus which includes a plurality of longitudinally spaced arm assemblies is provided. Each of the arm assemblies includes a plurality of arms which are radially pivotable. Each arm carries an electrode thereon. With such an arrangement, the plurality of electrodes are located at different axial levels and at different circumferential positions on each axial level. Such an axially and circumferentially arranged multi-electrode system guarantees the reliability of the obtained data and permits the measurements to be carried out at high accuracy. Indeed, if circumferential potential difference measurements and circumferential resistance measurements are carried out, the flow of current around the casing may be calculated. Not only is this information useful as a quality control for the corrosion rates derived from axial measurements, but the flow of current around the casing is useful information in its own right, i.e., for localising and quantifying corrosion as accurately as possible.

It is to be noted, further, that the electrodes of the present invention are preferably located at four different axial levels, thereby permitting electrical determinations to be carried out with different resolutions. For example, if currents in the casing are large, small spacing measurements (e.g. between adjacent axial levels) will give high resolution. If currents in the casing are low, a large spacing measurement (between the outermost axial levels) will give acceptable accuracy when the signal level for the short spacing is too low. In addition, with the electrodes arranged at different locations circumferentially as well as axially, a potential difference between any two points on the casing and a current flowing in any direction in the casing, if a sufficient number of electrodes are provided, can be measured. Moreover, two or more measurements can be taken at the same time with the multi-electrode arrangement. For example, parallel measurements taken for two or more pairs of electrodes with the same axial spacing can be used as a quality control. In fact, the difference between different axial measurements with the same spacing can be used as an indicator of localised corrosion.

Another advantage of multi-electrode measurements is the increased probability of recording valid data if contact conditions of the electrodes are poor. For a downhole apparatus having four electrodes, the probability of recording a valid measurement requiring all four electrodes is $P^4$ if the probability of a single electrode making good contact is P. For a downhole apparatus having four sets of electrodes at four different axial locations with each set including three electrodes arranged circumferentially at the same axial location, with the three electrodes of each of the top and bottom levels being shorted together and with the three electrodes of each of the two intermediate levels being electrically isolated from each other, the probability of one of the measurements being valid is $(1-(1-P)^3)^2(1-(1-P^2)^3$, where only one of the electrodes at each of the top and bottom levels needs to be working, and where only one pair of corresponding electrodes at the intermediate levels (one at each level) needs to be working to have a valid measurement. Of course, if all of the three electrodes of each of the two intermediate levels were shorted together, then the probability of the single measurement being valid would be even higher, i.e., $(1-(1-P)^3)^4$.

In accordance with a still further aspect of the present invention, the electrodes of the casing diagnostic downhole apparatus are enclosed in an electrically insulating material excepting a predetermined section which comes into contact with the casing when the electrodes are moved to their advanced position. Such an enclosed structure permits the apparatus to be submerged in any kind of fluid; electrically conductive, or non-conductive. Thus, even when the casing is filled with a relatively electrically conductive fluid such as brine, the present apparatus having electrodes with an enclosed structure can be advantageously used without problem. The electrically insulating material may be provided in the form of a coating or molding on each of the electrodes. Alternatively or additionally, the insulating material may be formed in the form of a separate packer having a slit, which covers the corresponding electrode.

Other objects, features, and advantages of the invention will become apparent to those skilled in the art upon reference to the following detailed description of the invention and the accompanying drawings.

BRIEF DESCRIPTION OF THE DRAWINGS

FIG. 2 is an enlarged schematic diagram taken along the line V—V indicated in FIG. 5a, showing the detailed structure of the arm actuator section of the downhole apparatus with the arm assemblies in the advanced position;

FIG. 3 is a schematic diagram showing part of the arm actuator section of the downhole apparatus with the arm assembly in the retracted position;

FIG. 4 is a plan view diagram showing the arm assembly;

FIGS. 5a through 5c are schematic, cross sectional views taken respectively along lines I, II and III of FIG. 3;

FIG. 8 is a block diagram showing the overall electrical structure of one embodiment of the present downhole apparatus;

FIG. 9 is a partial block, partial circuit diagram showing the electrical structure of one embodiment of the present downhole apparatus;

FIG. 10a is a circuit diagram showing the reset stabilized offset operational amplifier which is advantageously applied to the electrical structure of the present downhole apparatus;

FIG. 10b is a circuit diagram showing an isolated chopper amplifier which may be used as an alternative preamplifier to the preamplifier of FIG. 10a;

FIG. 11 is a timing chart which is useful for explaining the operation of the reset stabilized operational amplifier shown in FIG. 10a;

FIGS. 12, 13 and 14a through 14f are schematic illustrations which are useful for explaining the six step measurement cycle carried out by the present downhole apparatus;

DETAILED DESCRIPTION OF THE PREFERRED EMBODIMENT

Figure 1A:
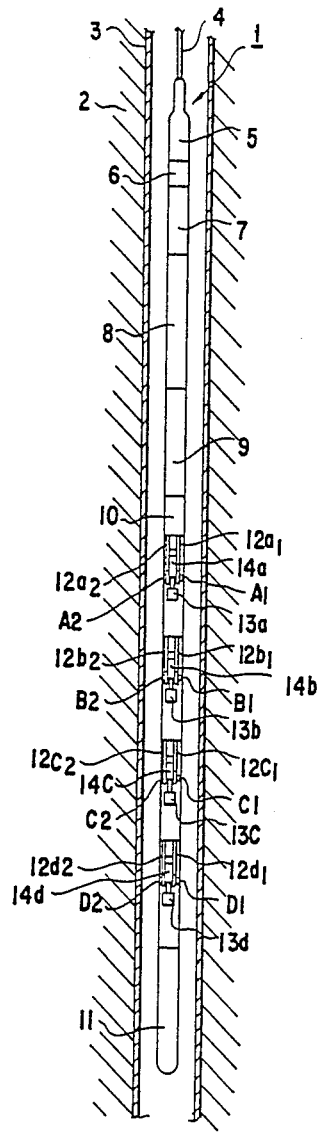
FIGS. 1a and 1b are schematic diagrams showing the borehole casing diagnostic apparatus of the present invention with its arm assemblies set in a retracted and advanced position respectively.
Figure 1B:
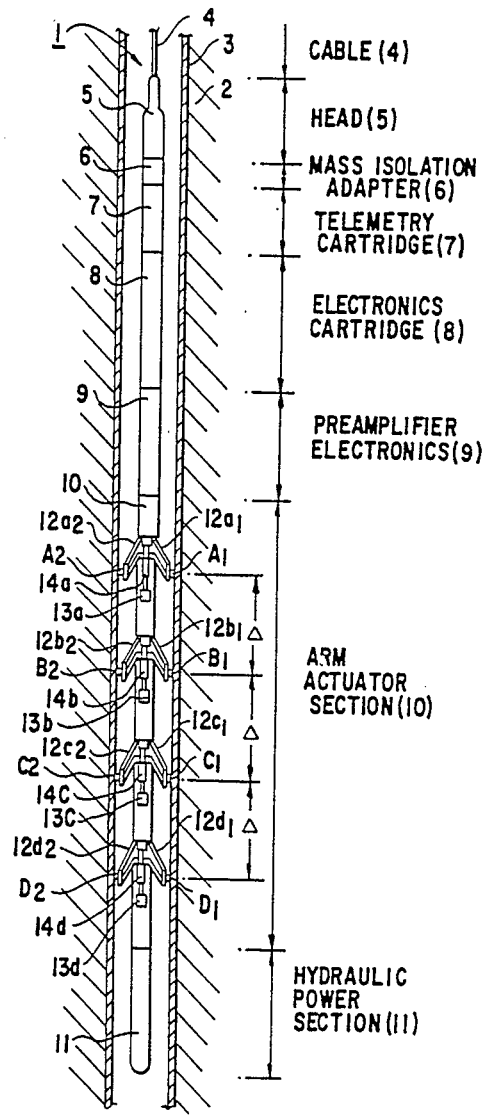
Figure 6A:
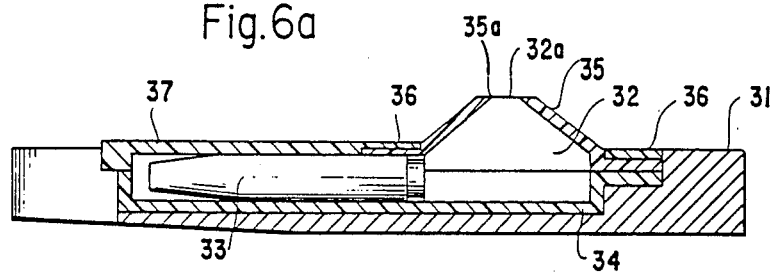
FIGS. 6a through 6d are schematic diagrams showing an electrode assembly which may be advantageously applied to the present downhole apparatus.
Figure 6B:
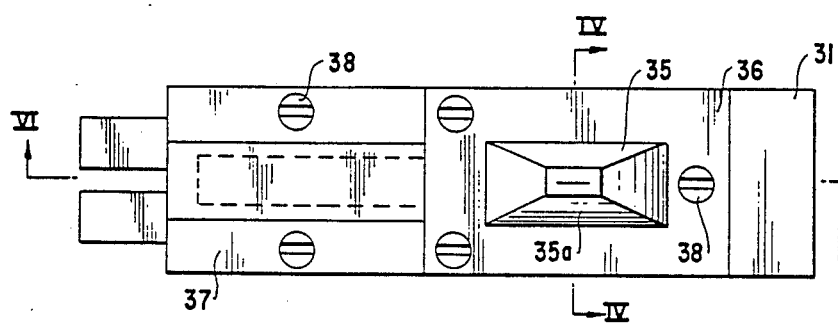
Figure 6C:
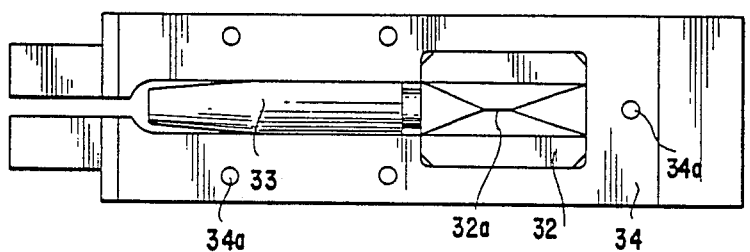
Figure 6D:
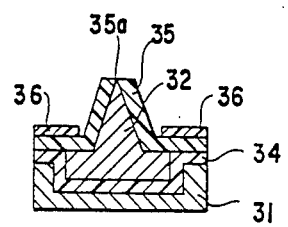

Referring to FIGS. 1a and 1b, a casing diagnostic downhole apparatus 1 constructed in accordance with one embodiment of the invention is schematically shown. As seen, a borehole casing 3 extends into the earth formation 2, and the downhole apparatus 1 having a generally torpedo shape is suspended by a cable 4 in the casing 3. The cable 4 is typically a composite cable including a plurality of conductors, each of which is clad with an insulating material, and a high strength wire. Although not shown, the cable 4 extends upward and it is connected to a surface processing unit (not shown) located at the ground surface.

As indicated to the right in FIG. 1b, the downhole apparatus 1 includes a plurality of sections along its longitudinal axis. The downhole apparatus 1 includes a head 5 at its top, to which the cable 4 is mechanically coupled, and a mass isolation adapter 6 which electrically isolates the downhole apparatus 1 from the cable 4 thereby preventing any possible galvanic coupling between the downhole apparatus 1 and the cable 4 or the downhole apparatus 1 and the casing 3 if the cable 4 touches the casing 3. The downhole apparatus 1 also includes a telemetry communication cartridge 7 adjacently below the mass isolation adapter 6. The telemetry communication cartridge 7 is electrically connected to the surface unit (not shown) via the cable 4 so as to carry out communication between the downhole apparatus 1 and the surface unit. The downhole apparatus 1 also includes an electronics cartridge 8 and a preamplifier electronics module 9, which include various electronics and electrical elements to define measurement units which directly measure desired electrical properties. While this aspect of the invention will be described more in detail hereinafter, it should be noted that cartridge 8 and module 9 process and convert measured analog data into digital data which are then transmitted upward to the surface unit (not shown) from the telemetry communication cartridge 7 through the cable 4.

Also provided in the downhole apparatus 1 is an arm actuator section 10 which includes four identical arm assemblies 12a, 12b, 12c and 12d disposed at four different axial locations along the apparatus 1. The arm assemblies are preferably equally spaced apart from each other such that the distance between each adjacent set of arm assemblies is L. Since the arm assemblies 12a, 12b, 12c and 12d are identical in structure, a description will be made only with respect to the top arm assembly 12a. It will be appreciated that identical reference numerals with different small English letters will be indicative of the different axial levels. In the preferred embodiment, the distance L is set at approximately two feet (0.6 meters), although the present invention should not be limited only to this particular distance or even to arm assemblies located at equally spaced distances. It is to be noted that, in the illustrated embodiment, each arm assembly, for example 12a, includes three arm sub-assemblies 12a1, 12a2 and 12a3 which are arranged in the circumferential direction at the same axial level. The sub-assemblies 12a1, 12a2 and 12a3 are arranged to pivot radially between a retracted position where the arm sub-assemblies, e.g., 12a1, 12a2 and 12a3 are received in respective recesses defined in the housing of the downhole apparatus 1 as shown in FIG. 1a, and an advanced position where the arm sub-assemblies extend radially outwardly so as force corresponding electrodes A1, A2, A3 carried thereon into contact with the internal peripheral surface of the casing 3 as shown in FIG. 1b. Thus, FIG. 1a shows the downhole apparatus in a closed condition with all of the electrodes A through D located in their retracted positions along provided recesses in the apparatus. In such a condition, the downhole apparatus 1 may be moved along the vertical length of the casing 3. FIG. 1b, on the other hand, shows the downhole apparatus in its open condition where all of the electrodes A through D are moved radially outwardly to the advanced position so as to be pressed against the internal peripheral surface of the casing 3. Although not shown in FIGS. 1a and 1b, it is to be noted that, in the preferred embodiment of the present invention, each of the arm assemblies 12a, 12b, 12c and 12d includes spring means which normally biases the associated arm assembly into the advanced position as will be described later. It should further be noted that even if the downhole apparatus 1 is set in the open state as shown in FIG. 1b, the downhole apparatus 1 may be moved vertically along the casing 3 with the electrodes A through D sliding along the internal peripheral surface of the casing 3, if desired.

The arm actuator section 10 also includes four driver shafts 14a, 14b, 14c and 14d which are operatively coupled to hydraulic jacks 13a, 13b, 13c and 13d, respectively. As will be described in detail hereinafter, these hydraulic jacks 13a through 13d are hydraulically connected via a hydraulic line to a hydraulic control unit, including a motor, a pump, etc., disposed inside of a hydraulic power section 11 provided at the bottom of the downhole apparatus 1. The hydraulic line runs along the arm actuator section 10 from the hydraulic power section 11. The hydraulic power section 11 is preferably also operatively connected to the electronics cartridge 8 so that the activation and deactivation of the hydraulic power is controlled in accordance with a control signal supplied from the surface unit at the ground surface through the cable 4. It should thus be understood that in the case where the arm assemblies 12a through 12b are normally spring-biased toward the open position, when the hydraulic power section 11 is deactivated, the arm assemblies 12a through 12d will be moved radially outward to take the open position as shown in FIG. 1b; whereas, when the hydraulic power section 11 is activated, the arm assemblies 12a through 12d will be moved radially inward to take the retracted position as shown in FIG. 1a.

Now, with reference to FIGS. 2 through 4 and 5a through 5c, the structure of the arm assemblies 12a through 12d, and in particular arm assembly 12a, will be described in detail. As may be best seen in FIGS. 5a through 5c, the arm assembly 12a includes three identical arm sub-assemblies 12a1, 12a2 and 12a3 which are arranged in the circumferential direction, preferably at equal angular intervals, i.e., 120 degrees, around the longitudinal centerline of the downhole apparatus 1. Since the arm sub-assemblies 12a1, 12a2 and 12a3 are identical in structure, only the arm sub-assembly 12a1 will be described in detail below. The corresponding elements of the other two arm sub-assemblies 12a2 and 12a3 are indicated by subscripts "2" and "3", respectively. As seen in FIG. 4, the arm sub-assembly 12a1 includes a pair of follower arms 20a1, 20a1, which are pivoted to a housing or body 1a of the downhole apparatus 1 at pivots 21a1, 21a1, respectively, a pair of driver arms 22a1, 22a1, which are pivoted to the housing 1a at pivots 23a1, 23a1, respectively, and an electrode support plate 24a1 which is pivotally connected to the forward ends of the follower and driver arms 20a1 and 22a1 at pivots 25a1 and 26a1, respectively. Since the pivots 21a1, 23a1, 25a1 and 26a1 together define a parallelogram, the electrode support plate 24a1 is supported so as to always be in parallel with the longitudinal axis of the downhole apparatus 1 even if the follower and drive arms 20a1 and 22a1 pivot around the pivots 21a1 and 23a1 in unison. As will be described in more detail hereinafter, the electrode support plate 24a1 supports the corresponding electrode A1 and permits it to project radially outwardly. Thus, the top surface of the electrode A1 supported by the support plate 24a1 comes into contact with the internal peripheral surface of the casing 3 when the arm assembly 12a is set in its advanced position.

As is best seen in FIGS. 2 and 5b, the follower arms 20a1 have a simple elongated shape, while the driver arms 22a1, which are pivoted to the body 1a of the downhole apparatus at its angled section, are generally L-shaped. As described above, one end of the L-shaped driver arms 22a1 is pivotally connected to the electrode support plate 24a1, while the other end is in engagement with a circular projection 15a which is integrally formed on the driver shaft 14a. Also as afore-described, the hydraulic jack 13a is fixedly mounted on the housing 1a. The hydraulic jack 13a is arranged to partly receive one end of the driver shaft 14a. The other end of the driver shaft 14a is slidably received in a guide hole 16a which is defined in the housing 1a. Thus, as is seen with reference to FIG. 2, when a hydraulic pressure is applied to the jack 13a, the driver shaft 14a projects outwardly so that the driver arms 22a1 are forced to pivot clockwise around the pivots 23a1, thereby bringing the arm sub-assembly 12a1 and hence the electrode A1 into the retracted position shown in FIG. 3. On the other hand, the arm sub-assembly 12a1 also includes a composite leaf spring 27a1 whose base end is fixedly attached to the housing 1a by means of fixing means 28a1 and whose forward end is pivotally connected to the electrode support plate 24a1 through a connector 29a1, to which a roller 30a1 is rotatably mounted. Thus, the arm sub-assembly 12a1 is normally biased into its advanced position as shown in FIG. 2 under the force of the spring 27a1. Accordingly, when the hydraulic pressure applied to the jack 13a is released, spring 27a1 forces the arm sub-assembly 12a1 to move radially outward so as to take the advanced position shown in FIG. 2. Thus, as understood, FIG. 1b shows the condition in which all of the arm assemblies 12a through 12d are forced to move radially outward under spring force so that the electrodes A through D are all pressed against the internal peripheral surface of the casing 3.

In the illustrated embodiment, the housing 1a of the downhole apparatus 1 is provided with three recesses arranged in the circumferential direction at equal angular intervals corresponding in position to the associated arm sub-assemblies, e.g., 12a1, 12a2 and 12a3, so that these arm sub-assemblies may be received in the respective recesses when set in the retracted position as shown in FIGS. 3 and 4. When the arm sub-assemblies are all retracted, all of the electrodes A through D are located radially inward with respect to the outermost peripheral point of the housing 1a so that the electrodes A through D are prevented from unintentionally coming into engagement with undesired objects. It should also be noted that the follower arms 20a1 are located inward of the drive arms 22a1 so that they are prevented from interfering with each others pivotal motion. As shown in FIGS. 4 and 5a through 5c, the housing 1a is formed with a pair of holes 1b, 1b, in which the pivots 21a1, 21a1 are fitted, and a pair of holes 1c, 1c, in which the pivots 23a1, 23a1 are fitted.

Figure 7:
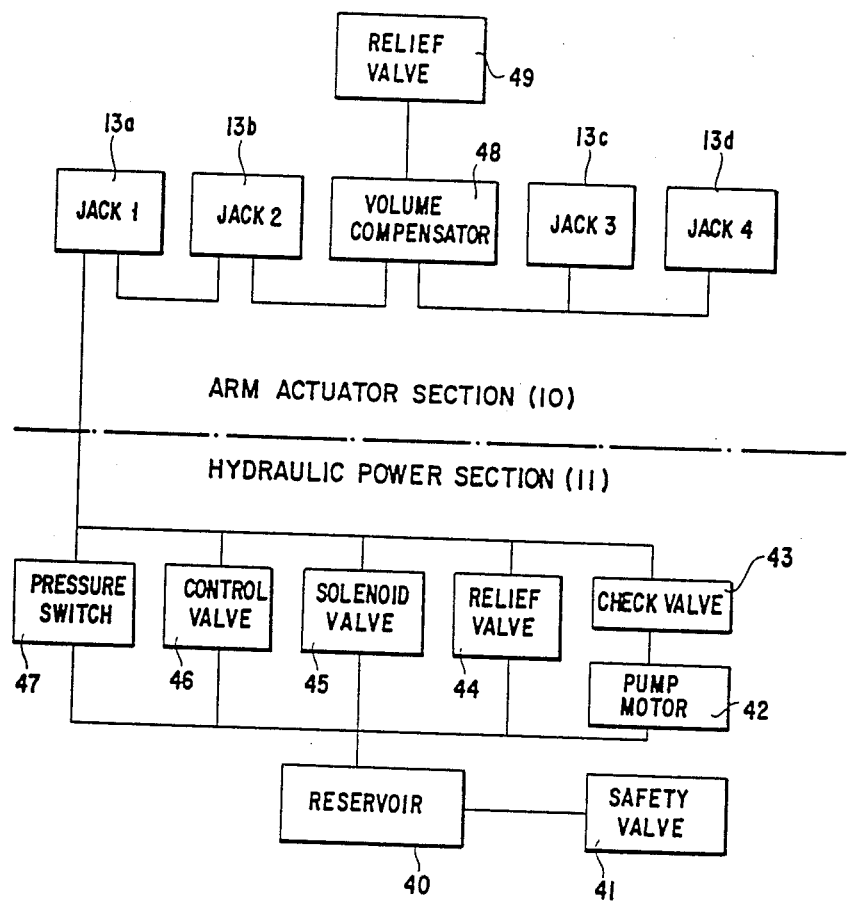
FIG. 7 is a block diagram showing the hydraulic connection between various elements in the arm actuator and hydraulic power sections of the downhole apparatus.

FIG. 7 shows in block diagram the hydraulic connection between the arm actuator section 10 and the hydraulic power section 11. As shown, the hydraulic power section 11 includes a reservoir 40 for storing a quantity of working fluid, such as oil, and a safety valve 41 connected to the reservoir 40. Also provided in the hydraulic power section 11 as being in fluidic communication with the reservoir 40 are a pump motor 42, a relief valve 44, a solenoid valve 45, a control valve 46 and a pressure switch 47. A check valve 43 which is connected to the outlet of the pump motor 12 is also provided. Thus, when the pump motor 42 is activated, the oil in the reservoir 40 is supplied under pressure to each of the jacks 13a through 13d in the arm actuator section 10, and, thus, the arm assemblies 12a through 12d are brought into the closed condition as described before. On the other hand, after stopping the pump motor 42, when the solenoid valve 45 is opened, i.e., deactivating the hydraulic power section 11, the oil is returned to the reservoir 40 from the arm actuator section 10 under the recovery force of the springs 27. It should be noted, however, that, in the illustrated embodiment, the operation of the arm assemblies 12a through 12d has been carried out hydraulically; however, it can also be done mechanically, electrically or magnetically as is obvious for one skilled in the art.

FIGS. 6a through 6d show an electrode assembly which can be advantageously applied to the above-described downhole apparatus 1. As shown, the electrode assembly has an enclosed structure and it includes a base 31, for example, of steel generally in the shape of a ship with its top central portion recessed. A bottom insulator 34 of, preferably, PEEK (Poly-Ether-Ether-Ketone) is placed on the top surface of the base 31, and then an ax-shaped electrode 32 having a top edge 32a sits on the bottom insulator 34 so that the electrode 35 is electrically isolated from the steel base 31. It is to be noted that the electrode 35 corresponds to any one of the electrodes A through D shown in the other drawings. In the preferred embodiment, the electrode 35 is coated with an electrically insulating material, preferably Viton. The electrode 32 is integrally provided with a socket connector on which a rubber boot 33 is fitted. Thus, the electrode 32 is electrically connected to the electrical circuit formed in the electronics cartridge and preamplifier electronics sections 8 and 9 through a socket connector and interconnection lines (not shown). Also provided is a packer 35 of, preferably, Viton which encloses the ax-shaped electrode 32. The packer 35 has a truncated pyramid shape and it is formed with a slit 35a at its top flat surface. In this manner, the apex edge 32a of the ax-shaped electrode 32 can come into contact with the internal peripheral surface of the casing 3 through the slit 35a when the electrode 32 is located at its advanced position and pressed against the casing 3.

A pair of covers 37 and 36, preferably of PEEK, are placed on the connector and electrode sections, respectively, as shown. The covers 37 and 36 are fixedly attached to the base 31 by means of screws 38 which are screwed into threaded holes (not shown) formed in the base 31 through the holes 34a formed in the bottom insulator 34. It should thus be clear that the electrode 32 is enclosed by an electrically insulating material excepting a predetermined apex edge 32a section which may be exposed through the slit 35a when the electrode 32 is pressed against the casing 3. In the above-described embodiment, the electrode 32 is coated with an insulating material and enclosed in the packer 35. It is to be noted, however, that the packer 35 may be molded on the electrode 35 with or without coating. Alternatively, the electrode 35 may be simply placed in the packer 35 without coating, if desired. When the electrode 32 is coated, its apex edge 32a may also be coated because the coating on the apex edge 32a may be removed when the electrode 32 is first pressed against the casing 3. However, it is true that it is preferable to provide no coating on the apex edge 32a.

Now, turning to FIG. 8, the electrical structure of one embodiment of the casing diagnostic downhole apparatus 1 will be described. In FIG. 8, eight electrodes A, B1-B3, C1-C3 and D are seen. As is understood, A refers to the topmost stage, B to the second highest stage, C to the third highest state and D to the bottom stage. As described above, in the preferred embodiment, three electrodes are circumferentially arranged at each stage, i.e., A1-A3, B1-B3, C1-C3 and D1-D3. However, in accord with the embodiment of FIG. 8, the three electrodes of each of the top and bottom stages, i.e., A1-A3 and D1-D3, are shorted together. Thus, in effect, there is only a single electrode at levels A and D, and hence only one electrode A and D is shown for the top and bottom stages in FIG. 8. The electrical structure shown in FIG. 9 which substantially corresponds with the FIG. 8 embodiment includes four identical amplifier circuits 51, 52, 53, and 54 whose two input terminals are connected to paired electrodes B1-C1, B2-C2, B3-C3, and A-D, respectively. As will be described hereinafter, each of the identical amplifier circuits 51 through 54 has a two-stage structure comprised of a preamplifier and main amplifier which are basically identical in structure and which both include a reset stabilized operational amplifier, which will also be described in detail hereinafter. The preamplifier section, which is the first half of each of the amplifier circuits 51 through 54 is provided in the preamplifier electronics section 9, while the latter half is provided in the electronics cartridge section 8 as indicated by the dotted line in FIG. 8. Since each of the amplifier circuits 51 through 54 is connected to a corresponding pair of electrodes, any desired electrical property, such as potential difference and resistance (measured potential difference divided by known injected current), present across the corresponding pair of electrodes can be directly measured by the amplifier circuits 51 though 54 when the electrodes are pressed against the casing 3.

In the embodiment shown by FIGS. 8 and 9, all of the four amplifier circuits 51 through 54 have their output terminals connected to a multiplexer 57. Also provided in the electronics cartridge section 8 is another amplifier circuit 55 which is similar in structure to the other amplifier circuits 51 through 54 excepting that it has only one stage. The amplifier circuit 55 has two input terminals, across which is provided a resistor R, and an output terminal which is also connected to the multiplexer 57. A current source 56 is provided and connects to one end of the resistor R. The current source is used to supply a known current to selected electrodes when the contact resistance between the electrodes and the casing 3 is to be measured as a quality control or when casing resistance is to be measured.

The multiplexer 57 of the electronics cartridge section 8 has amplifiers 51 through 55 as its inputs, and its output terminal is connected to an analog-to-digital (A/D) converter 59 through an auto-gain ranger 58. The auto-gain ranger 58 allows signals of very different levels, which might arise as a result of different measuring modes or steps, to be digitized by the same circuitry for a given gain depending on the signal level. The A/D converter 59 is connected via a bus to a downhole tool bus interface (DTB I/F) 60 which is also connected to a control logic 61. The DTB I/F 60 is also connected to the telemetry communication cartridge (TCC) 7. The TCC is in turn connected to both a power supply 62 in the electronics cartridge section 8 and via cable 4 to a surface processing unit 50, typically including a computer, at the ground surface.

With the electrical structure of the FIG. 8–FIG. 9 embodiment, the computer in the surface unit 50 sends commands to the control logic 61 in the electronics cartridge section 8 through the cable 4. The control logic 61 then supplies various control signals to various elements in the electronics cartridge section 8 to control the various steps in a measurement cycle. The power required to operate various electronics elements is also supplied from the surface unit 50 via the power supply 62. For example, when a potential difference measurement is to be carried out, the potential difference present across two pairs of electrodes in contact with the casing 3 is directly measured in the form of an analog signal and amplified by the corresponding amplifer circuit 51, 52, 53 or 54. The measured and amplified signal is then converted into digital data, which is then transmitted to the surface unit 50 through the cable 4. In this manner, in accordance with this aspect of the present invention, since a desired electrical property is directly measured locally and digitized before being transmitted to the surface unit 50 through the long cable 4, measurements can be carried out at high S/N ratio and at high accuracy even if the electrical property to be measured is relatively small in magnitude.

Figure 10B:
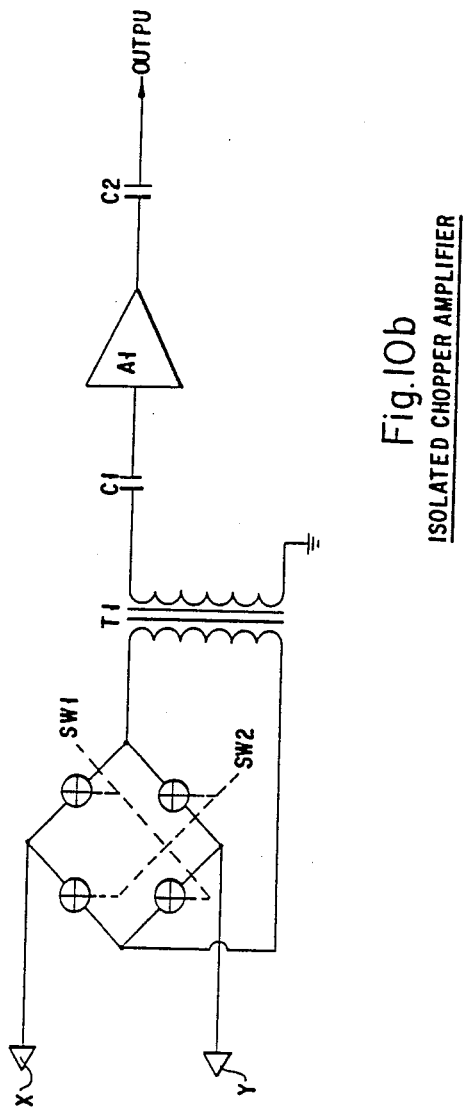
Figure 11:
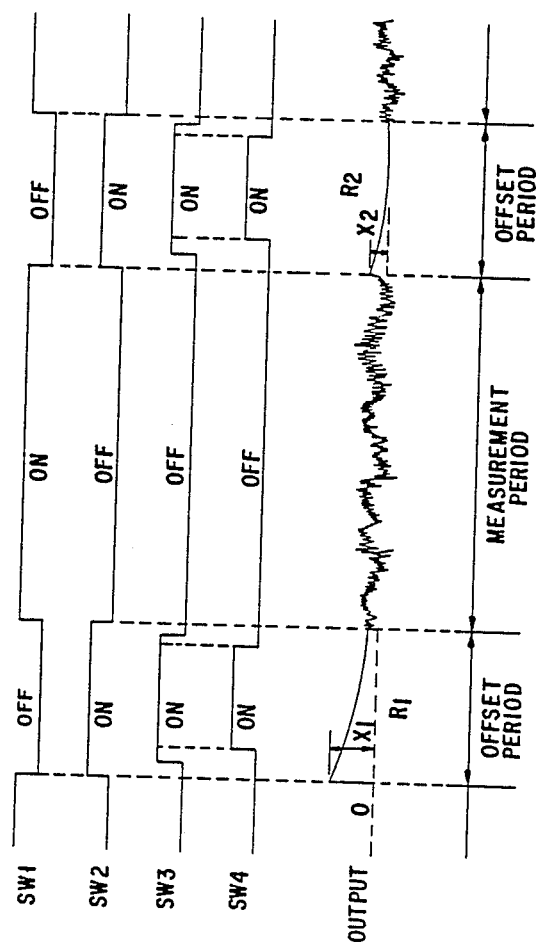

Turning to FIGS. 10a and 11, the structure and operational characteristics of the reset stabilized operational amplifier employed in each of the amplifier circuits 51 through 55, according to one embodiment of the invention is seen. FIG. 10a shows a reset stabilized operational amplifier as used as the first stage of each of the two-stage amplifier circuits 51 through 54. The reset stabilized op amp includes a main d.c. amplifier A1 which has a pair of first input terminals, a second input terminal and an output terminal. The pair of first input terminals of the amplifier A1 is connected to a corresponding pair of electrodes X and Y (in the illustrated example, X-Y corresponds to one of the four electrode pairs B1-C1, B2-C2, B3-C3 and A-D) through a pair of input switches SW1 which are turned on and off together as indicated by the dotted line. The pair of first input terminals of the amplifier A1 is also connected to a reference voltage, usually ground, through another pair of reset switches SW2 which are also operated together. The output of amplifier A1 of the preamplifier is connected both to the second input terminal of the amplifier A1 via a negative feedback loop, as shown in FIG. 10a, and to the input terminal (or non-inverting input terminal) of the main d.c. amplifier of the second stage of the two-stage amplifier (i.e. the amplifier stage of electronics cartridge section 8).

The feedback loop from the output of main d.c. amplifier A1 to its second input terminal includes in series: a sampling switch SW3 for sampling an offset voltage produced by the main d.c. amplifier A1 at its output terminal; an a.c. offset amplifier A2 for detecting and amplifying the offset voltage sampled by the sampling switch SW3; a holding switch SW4; and a holding amplifier A3. A pair of capacitors C1 and C2 are also preferably provided, with the capacitor C2 being connected in series between switch SW3 and the input to offset amplifier A2, and capacitor C1 being connected in series beteen the output terminal of the a.c. offset amplifier A2 and switch SW4. In addition, a holding capacitor CH is provided as connected between the input terminal of the holding amplifier A3 and ground. The holding capacitor CH temporarily holds the offset voltage from the main d.c. amplifier A1 after having been amplified by the a.c. offset amplifier A2 for a period between the on and off operation of the holding switch SW4. The offset voltage temporarily stored in the holding capacitor CH is applied to the second input terminal of the main d.c. amplifier A1 through the holding amplifier A3 and thereby permits the offset voltage to be effectively cancelled at the amplifier A1. In this manner, an electrical property measured across the pair of electrodes X and Y along the casing 3 can be amplified by the main d.c. amplifier A1 and supplied as its output without including the offset voltage of the amplifier A1.

Now, referring particularly to FIG. 11, it is seen how the reset stabilized operational amplifier shown in FIG. 10a operates to measure a desired electrical property present across the pair of electrodes X and Y along the casing 3 without being adversely affected by the offset voltage of the main d.c. amplifier A1. In the timing chart shown in FIG. 11, the reference characters indicated in the left side column correspond to those elements having identical reference characters in the circuit of FIG. 10a. As indicated in FIG. 11, initially, the switches SW1, SW3 and SW4 are all off and the switches SW2 are on, so that the pair of first input terminals of the amplifier A1 is grounded. Under such a "grounded" condition, the main d.c. amplifier A1 supplies at its output terminal an offset voltage h1, as is seen in FIG. 11. Then, when the sampling switch SW3 is turned on, the output offset voltage h1 is sampled and amplified by the amplifier A2, and, shortly thereafter, since the holding switch SW4 is turned on, the holding capacitor CH is charged with a charge corresponding to the so amplified offset voltage. At the same time, this offset voltage is fed back to the second input terminal of the amplifier A1 through the amplifier A3. Since this fed back offset voltage is applied to the second input terminal of the amplifier A1 with a phase shift of 180 degrees, the original offset voltage h1 is reduced by the factor of 1/(gain of amplifier A2). Then, after a predetermined period of time, the holding switch SW4 is turned off. As a result, the voltage input to the amplifier A3 is dictated by the voltage over storage capacitor CH which was previously shown to be the amplified offset voltage. With such a voltage input, the amplifier A3 keeps applying the holding capacitor offset voltage until the holding switch SW4 is again turned on.

After switch SW4 is turned off, switches SW3 and SW2 are turned off in succession, thus ending the offset period as indicated in FIG. 11. Simultaneous with the turning off of switches SW2, the pair of input switches SW1 are turned on. With input switches SW1 on, the amplifier A1 sees an electrical signal indicating a desired electrical property such as a potential difference present between the pair of electrodes X and Y along the casing 3. Amplifier A1 then amplifies the potential difference and outputs the amplified signal. The period of time switches SW1 are on corresponds to a measurement period during which a measurement of a desired electrical property across the electrodes X and Y along the casing is carried out. Then, the pair of input switches SW1 are again turned off and at the same time the pair of reset switches SW2 are turned on to ground the pair of first input terminals of the amplifier A1. The amplifier A1 responds by supplying another offset voltage h2 at its output terminal, and the entire sequence of steps is repeated. As the sequence is repeated over and over again, the level of the offset voltage output from the amplifier A1 gradually decreases and eventually becomes virtually zero. Since the time constant for this decrease in offset voltage is much larger than the measurement time period, such a decrease in offset voltage in no way affects the readings by the amplifier A1.

An alternative embodiment to the preamplifier section of the amplifiers 51–54 is seen in FIG. 10b. The preamplifier shown in FIG. 10b is an isolated chopper amplifier which is comprised of two pairs of switches SW1 and SW2, a transformer T1, two capacitors C1 and C2, and an operational amplifier A1. The switch pairs are coupled as indicated by the dotted lines such that switches SW1 are off when switches SW2 are off, and vice versa. As will be appreciated, the provided arrangement chops the input signal received via electrode pair X-Y, and modulates the signal into a double side band chopped waveform. The transformer eliminates large common mode error voltages, and the amplifier A1 and capacitors C1 and C2 basically comprise an AC amplifier which removes the DC offset of A1. The output of the isolated chopper amplifier is then preferably sent to the amplifier section generally represented by FIG. 10a prior to being sent via the TCC uphole.

Returning to FIG. 9, the structure of the current source 56 (of FIG. 8) is seen. The current source basically includes four current sources I1 through I4 and a plurality of associated switches S1 through S4 and S9 through S15. It is to be noted in FIG. 9 (as opposed that FIG. 8), that the top-stage three electrodes which are shorted together and thus indicated by A and the amplifier circuit 54 are located near the top of the drawing. Also shown in FIG. 9 is a spontaneous potential unit or digitizer 63 at the ground surface. The digitizer 63 is connected to the downhole apparatus 1 by the cable 4. In the illustrated embodiment, the current sources I1 through I3 are identical and are arranged to supply a current equal to 1 mA, whereas, the current source I4 supplies a larger current equal to 0.5 A. It will be recognized that if an even larger current source I4 were to be available, the accuracy of the measurements would be improved.

In the embodiment of FIG. 9, the current source I1 is so connected that it supplies a small current of 1 mA across the pair of electrodes B1 and C1 along the casing 3 when a pair of switches S1, S1, which are operated together as indicated by the connecting dotted line, is closed and a switch S13 is closed. Such an arrangement corresponds to the injection of a small axial current along the casing 3 between the two electrodes B1 and C1 which are arranged in the longitudinal direction. It should be noted that switches S12 and S13 are also in operative association as indicated by the dotted line such that when the switch S13 is closed, the switch S12 is open and when the switch S13 is open, the switch S12 is closed. Thus, if the switch S13 is open and the switch S12 is closed when the switches S1, S1 are closed, the current source I1 supplies a current of 1 mA across the pair of electrodes B1 and B2 along the casing 3. This corresponds to the injection of a small current in the circumferential direction on the casing 3 because the electrodes B1 and B2 are located at the same axial position. On the other hand, when switches S2, S2 are closed with the switch S12 open, the current source I2 supplies a current of 1 mA across the pair of electrodes B2 and C2 along the casing 3. Because switches S14 and S15 are operated at the same time such that one of them is open when the other is closed, if the switch S14 is open and the switch S15 is closed when switches S3, S3 are closed, the current source I3 supplies its current of 1 mA across the electrodes B3 and C3 along the casing 3 in the longitudinal direction thereof. However, if the switch S14 is closed with the switch S15 open when the switches S3, S3 are closed, the current supplied by the current source I3 flows across the two electrodes C2 and C3 along the casing 3 circumferentially.

The previously described amplifier circuit 51, which contains two stages of the previously described reset stabilized operational amplifier (or one stage of the isolated chopper amplifier and one stage of the reset stabilized op amp), has its inverting input terminal connected to the electrode B1 at the second highest axial position and its non-inverting input terminal connected to a switch S9. Thus, when the switch S9 is off, it causes the non-inverting input terminal of the amplifier 51 to be connected to the electrode C1 at the third highest axial position. On the other hand, when the switch S9 is on, the non-inverting input terminal of the amplifier 51 is connected to the electrode B2 at the second highest axial position. Again, as indicated by the dotted line, the switch S10 is operatively associated with the switch S9, and the inverting input terminal of the third amplifier circuit 53 is connected to the electrode B3 when the switch S10 is off and to the electrode C2 when the switch S10 is on while the non-inverting input terminal of the amplifier circuit 53 is always connected to the electrode C3. The second amplifier circuit 52 has its non-inverting and inverting input terminals connected to and disconnected from the respective electrodes B2 and C2 depending on as to whether its pair of switches S11, S11 is on or off, respectively.

The fourth amplifier circuit 54 has its inverting input terminal connected to the electrode A, which is a combination of three electrodes A1-A3 shorted together, and also to the digitizer 63 through a switch S6 and the cable 4. The non-inverting input terminal of the fourth amplifier circuit 54 is connected to the electrode D, which is also a combination of three electrodes (D1-D3) shorted together. The current source I4, which supplies a larger current of 0.5 A, is connected in series with the resistor R and it supplies the current of 0.5 A across the top and bottom electrodes A and D along the casing 3 when a pair of switches S4, S4 is closed. As shown in FIG. 9, the surface unit includes the digitizer 63 which has a pair of input terminals connected from a pair of surface reference potential sources REF1 and REF2 through a pair of respective switches S7, S7. Also provided is another pair of switches S8, S8, one of which is interposed between the two input terminals of the digitizer 63 with the other being interposed between one of the input terminals of the unit 63 and the cable 4. It is to be noted that the surface unit also includes a truck communication module 50a which is mounted in the surface unit 50 for communication with TCC 7 of the downhole apparatus 1. It should also be understood that all of the switches S1 through S4, S6, and S9 through S15 are operated by control signals supplied from the control logic 61 to which commands are supplied from the surface unit 50 via the cable 4. It will also be recognized that switches S7, S7, and S8, S8 are not required, as the reference potential sources REF1 and REF2 can be directly applied to the digitizer 63.

Figure 12:
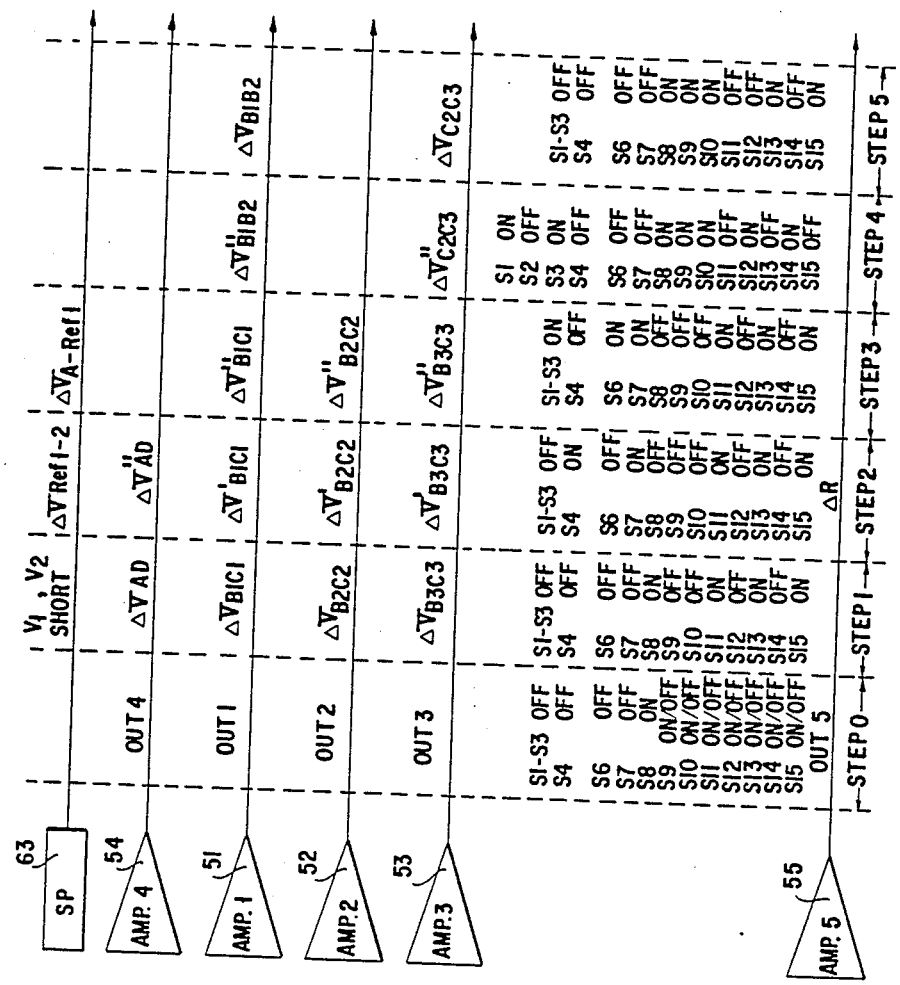
Figure 15:
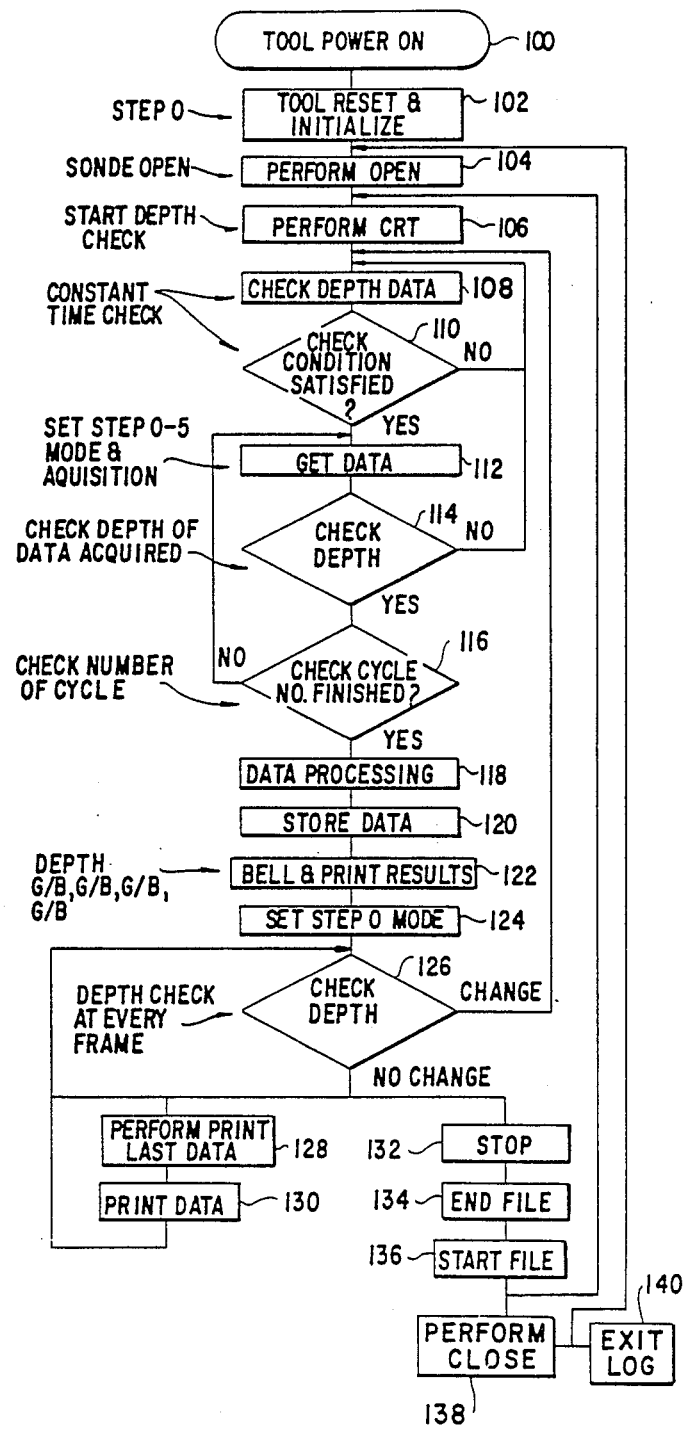
FIG. 15 is a flow chart showing the overall sequence of operations which may be carried out by the present downhole apparatus and method inventions.

The operation of the casing diagnostic downhole apparatus 1 having the above-described structure may best be seen with reference to FIGS. 12, 13, 14a through 14f and 15. In the illustrated embodiment, potential differences in the axial and circumferential directions between two points on the casing 3, casing resistances in the axial direction between two points on the casing 3, and contact resistances between the electrodes B, C and the casing 3 are measured as selected electrical properties in a six step measurement cycle. The six step cycle includes STEP0 through STEP5 as indicated in FIGS. 12 and 13, and, more particularly in FIGS. 14a through 14f. On the other hand, FIG. 15 shows the overall sequence of steps in the measurement operation.

The measurement operation is triggered and controlled by the software stored in a computer system (not shown) in the surface unit 50 at the ground surface. As seen in FIG. 15, with the tool power on at 100, the tool switches reset at 102, the sonde arms open at 104, the measurement cycle initialized at 106, when the downhole apparatus 1 is still moving, no data is being recorded, but the software is continually checking the depth at 108. When the software sees a constant depth for longer than a predetermined period, the stationary condition of step 110 is satisfied and the six step measurement cycle of step 112 is triggered. As seen at steps 114 and 116, all six steps are preferably accomplished at the same depth, and that depth is recorded. Once the measurement cycle is complete, the amplified digitized data which was being transmitted to the surface is processed at 118 and stored at 120. A bell may then be rung at 122 to indicate to the operator that the six step measurement cycle is complete and that the downhole apparatus 1 can be moved to another depth. As indicated by step 124, upon completion of the six step cycle, the apparatus 1 is set to the step 0 offset determination mode. Although not shown specifically, the surface unit 50 also includes a printer which prints out the measured results every time upon completion of the six step measurement cycle, and the printer also prints out a GOOD/BAD electrode contact condition for the contact resistance measurements based on an upper limit which has been selectively determined by the operator prior to the operation. Such an upper limit may be refined based on the data just taken. Accordingly, the operator at the ground surface knows when he can move the downhole apparatus 1 to another depth whenever the bell rings, and the operator has an immediate indication of whether the data is good or bad according to the contact resistance information. Once the software has finished the data acquisition, computation, rung the bell and printed out the results, it again starts to check the depth pulses at 126. Once it sees a change in depth, it then goes to the depth checking routine of steps 108 and 110 thereby looking for a cessation of depth pulses, which indicates that the downhole apparatus 1 has been located at another depth. It should be noted that the operator has the ability at steps 128 and 132 to enter instructions such as "print last data", and "stop". If the print last data step 128 is requested, a columnar print-out is provided at 130 instead of a log. If the program is stopped at 132, the file is closed at 134, and a new file is opened at step 136. If desired, initialization and preparation for additional logging may the continue. Otherwise, the arms are closed at 138. At that point, to continue, the program must go to step 104. Otherwise, the logging mode is exited at 140.

The six step measurement cycle carried out with the circuitry of the FIG. 8-FIG. 9 embodiment may be best understood with reference to FIGS. 12, 13 and 14a through 14f. FIGS. 14a through 14f correspond to the respective steps in the six step measurement cycle which includes:

(1) STEP0: AMP OFFSET MEASUREMENT
(2) STEP1: AXIAL POTENTIAL DIFFERENCE MEASUREMENT
(3) STEP2: CASING RESISTANCE MEASUREMENT
(4) STEP3: AXIAL CONTACT RESISTANCE MEASUREMENT
(5) STEP4: CIRCUMFERENTIAL CONTACT RESISTANCE MEASUREMENT
(6) STEP5: CIRCUMFERENTIAL POTENTIAL DIFFERENCE MEASUREMENT

As shown in FIG. 14a, the downhole apparatus 1 includes three circumferentially arranged electrodes at four different axial levels. But, since the electrodes A1-A3 at the top level are always shorted together and the electrodes D1-D3 are always shorted together, there are, in effect, 8 electrodes which are electrically isolated from each other. It is to be noted, however, that during measurements all of the electrodes A-D are in contact with the inner peripheral surface of the casing 3. In FIG. 12, the ON/OFF condition of each of the switches S1 through S4 and S6 through S15 shown in FIG. 9 in each of the six steps STEP0 through STEP5 is indicated column by column and the electrical properties measured in each step are also indicated in each column. On the other hand, FIG. 13 shows a stream of data supplied from the A/D converter 59 eventually to the surface unit 50 through the cable 4 in each of the six steps STEP0 through STEP5.

At STEP0, the inverting and non-inverting input terminals of each of the five amplifier circuits 51 through 55 are shorted and commonly connected to ground. This corresponds to the case in which the switches SW1, SW1 are turned off and the switches SW2, SW2 are turned on in the circuit of FIG. 10a. Thus, the amplifier circuits 51 through 54 supply their offset values OUT1 through OUT5 which are then supplied to the surface unit 50 through the cable 4 after having been digitized by the A/D converter 59.

At STEP1, the switches S1 through S4 and S6 through S15 are set as indicated in the STEP1 column of FIG. 12 so that an electrical connection is established such that the first amplifier circuit 51 measures a potential difference between the electrodes B1 and C1, the second amplifier circuit 52 measures a potential difference between the electrodes B2 and C2, the third amplifier circuit 53 measures a potential difference between the electrodes B3 and C3, and the fourth amplifier circuit 54 measures a potential difference between the electrodes A and D. In FIG. 14b, the two electrodes, across which an axial potential difference is measured, are circled and connected by the dotted curve line. Thus, the four potential difference data are taken, digitized by the A/D converter 59 and transmitted to the surface unit 50 in the form of a data stream shown at STEP1 in FIG. 13. It is to be noted that data (SP) is data which comes from the spontaneous potential unit 63 and added at the surface unit 50 for some other purposes.

At STEP2, the switches S4 in FIG. 9 are turned on so that a known injection current I4 (0.5 A in the present embodiment) is applied between the top and bottom electrodes A and D by the current source I4. In FIG. 14c, the injection of this current I4 is indicated by the arrow directed to the electrode A1. With this current flowing axially along the casing 3, the potential differences across the three pairs of vertically oriented electrodes B1-C1, B2-C2, and B3-C3 are measured thereby allowing the three casing resistances to be calculated. In addition, since the known current of 0.5 A is injected across the top and bottom electrodes A and D, the contact resistance between the top and bottom electrodes A and D and the casing 3 can be determined. In FIG. 13, the measured potential differences for use in the calculation of casing resistances are indicated by single primes and the measured potential differences for use in calculation of contact resistances are indicated by double primes.

At STEP3, the switches S1, S2 and S3 shown in FIG. 9 are all turned on so that the current sources I1 through I3 supply a small known current of 1 mA to the respective pairs of electrodes B1-C1, B2-C2 and B3-C3. The injection of these small currents is indicated by the arrows in FIG. 14d. With the injection of these small currents between the respective pairs of electrodes, the potential differences between the respective pairs of electrodes are measured, digitized, and supplied to the surface unit 50 where a calculation is carried out to obtain desired contact resistances. In this step, since the switch S6 is turned on, the potential difference between the electrode A and the surface reference is also measured.

At STEP4, the switches S9 and S10 of FIG. 9 are turned on and the switches S11 are turned off with the switches S1 and S3 turned on. With this arrangement, the first amplifier circuit 51 is connected to measure a potential difference between the two electrodes B1 and B2 on the second-level circumference and the third amplifier circuit 53 is connected to measure a potential difference between the two electrodes C2 and C3 on the third-level circumference. Thus, as shown in FIG. 14e, the small current of 1 mA is injected to flow along two circumferential paths on the casing 3. With this current injection, the circumferential potential difference is measured between the electrodes B1-B2 and also between C2-C3, and the thus measured results are digitized and transmitted to the surface unit 50. At the surface, calculations are made as to obtain the contact resistances between the electrodes B1-B2 and the casing 3 and between the electrodes C2-C3 and the casing 3.

At STEP5, the switches S1 and S3 of FIG. 9 are turned off, thereby terminating the injection of the small currents, and the first and third amplifier circuits 51 and 53 are connected to measure a potential difference between the electrodes B1 and B2 and between the electrodes C2 and C3, as indicated in FIG. 14f. Thus, the potential difference measurements are carried out between B1 and B2 and between C2 and C3 and the measured results are digitized and transmitted to the surface unit 50 thereby completing the six step measurement cycle.

It should be appreciated that while STEP0 provides an offset determination for the amplifiers 51–54, additional offset may be introduced into the system due to contact potentials across the feedthrough connections between the electrodes and the amplifier. These contact potentials and/or thermal EMFs are dependent on the temperature at the contact interface and on the actual metals which are contacts. In order to reduce this additional offset to a minimum, copper connection sockets and copper based feedthroughs have been used. However, because this offset may still be sizable, a determination of the same is desirable.

Figures 20A, 20B:
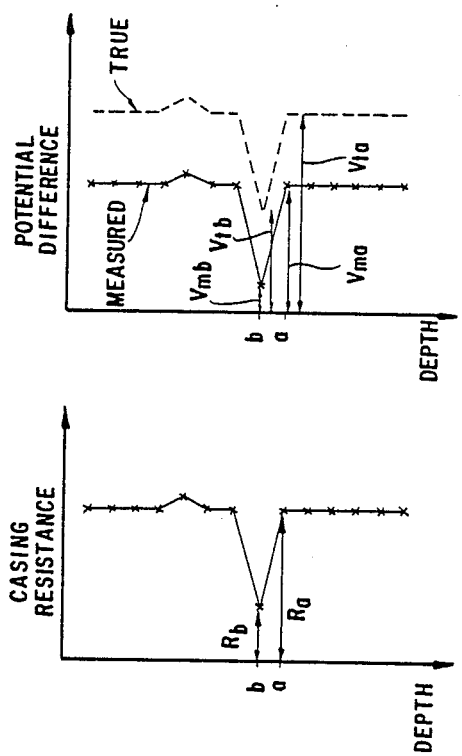
FIG. 20 shows casing resistance and potential difference plots over casing depth which are useful in calculating an electrode-amplifier connection offset.

A determination of the contact potential/thermal EMF offset can be made if casing resistance and potential difference measurements are made over a section of the casing where the casing resistance changes significantly, such as over a casing collar. As seen in FIG. 20, point "a" is assumed to be a point along the casing, and point "b" is assumed to be at a casing collar depth. If it assumed that the axial current flowing along the casing does not change, then the true potential difference divided by the casing resistance should be the same at both points. Thus, $V_{ta}/R_a = V_{tb}/R_b$. While the true potential differences $V_{ta}$ and $V_{tb}$ are unknown, the offset at points a and b should be the same where the offset changes varies only slowly over time. Hence, the difference between the true potential differences at the two points should be equal to the difference between the measured potential differences at the two points. Thus, $V_{ta} - V_{tb} = V_{ma} - V_{mb}$. Solving for $V_{tb}$:

$$V_{tb} = R_b(V_{ma} - V_{mb})/(R_a - R_b)$$

Then, the contact potential/thermal EMF offset may easily be determined by subtracting the measured potential difference at point b, $V_{mb}$, from the true potential difference $V_{tb}$ calculated above. It should be noted that because this determined contact potential/thermal EMF offset will drift slowly over time, calculations to determine the same may be made intermittently. Interim offset values may then be obtained via interpolation. It should also be noted that this additional offset should only be used as a correction factor where the potential difference determination does not already compensate for the same. In other words, because STEP0 will not be affected by this additional offset, any computation which involves a potential difference determination which includes the additional offset (e.g. STEP1) minus a STEP0 value will require an additional correction. On the other hand, were two potential difference determinations which each include the offset are substracted (e.g. STEP2−STEP1), the offset will be automatically cancelled.

Figure 16:
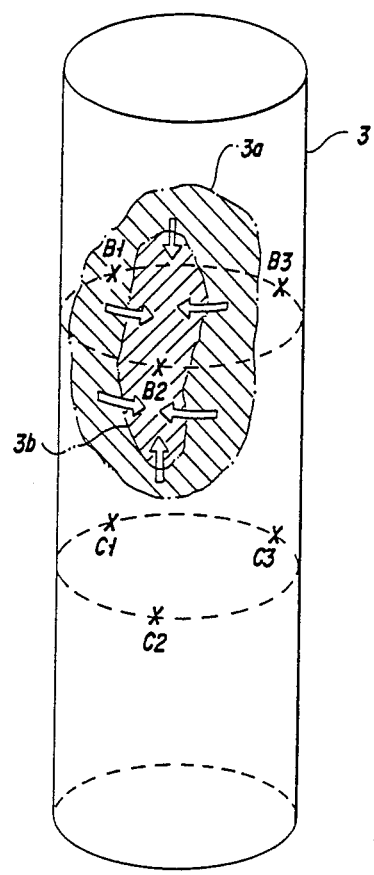
FIG. 16 is a schematic illustration showing how the two dimensional survey for determination of the position of localized corrosion can be carried out by the multi-electrode scheme of the present downhole apparatus.

As described above, in accordance with the present invention, since a plurality of electrodes are arranged at different circumferential positions as well as at different axial positions, two or more axial potential difference measurements can be carried out at different circumferential positions on the casing 3 at the same time and this will provide more detailed information as to the location of corrosion. Moreover, because the potential difference measurements are carried out axially as well as circumferentially, the position of local corrosion can be determined not only in the axial direction, but also in the circumferential direction. The importance of this aspect of the present invention may be better understood with reference to FIG. 16. Thus, FIG. 16 shows a section of the casing 3 in which a cathodic area 3a and an anodic area 3b are formed locally. The points of contact by the three second-level electrodes B1-B3 and third-level electrodes C1-C3 are indicated by crosses. It is seen that the electrode B2 is located in the anodic area 3b while the other electrodes are not located in either the cathodic and anodic areas 3a and 3b. The direction of the localized current flowing in the metal of the casing 3 from the cathodic area 3a to the anodic area 3b is indicated by the white arrows. Thus, net current will leave the casing 3 from the anodic area 3b to the surrounding earth.

Even if there is such a localized corrosion on the casing, the present invention allows the pin-pointing of the location of the corrosion because the axial potential difference between B2-C2 will be different than those between B1-C1 and B3-C3 and the circumferential potential difference between B2-B1 and B2-B3 will be different than those of C2-C1, C2-C3 and C1-C3. Of course, it will be appreciated that the resolution in the axial and circumferential directions is enhanced as the number of electrodes provided is increased. Thus, if four or more electrodes are disposed axially or circumferentially, a casing resistance between the two inner electrodes may be measured while passing an injected current between two outer electrodes (as is more completely described in Ser. No. 925,035).

Figure 17:
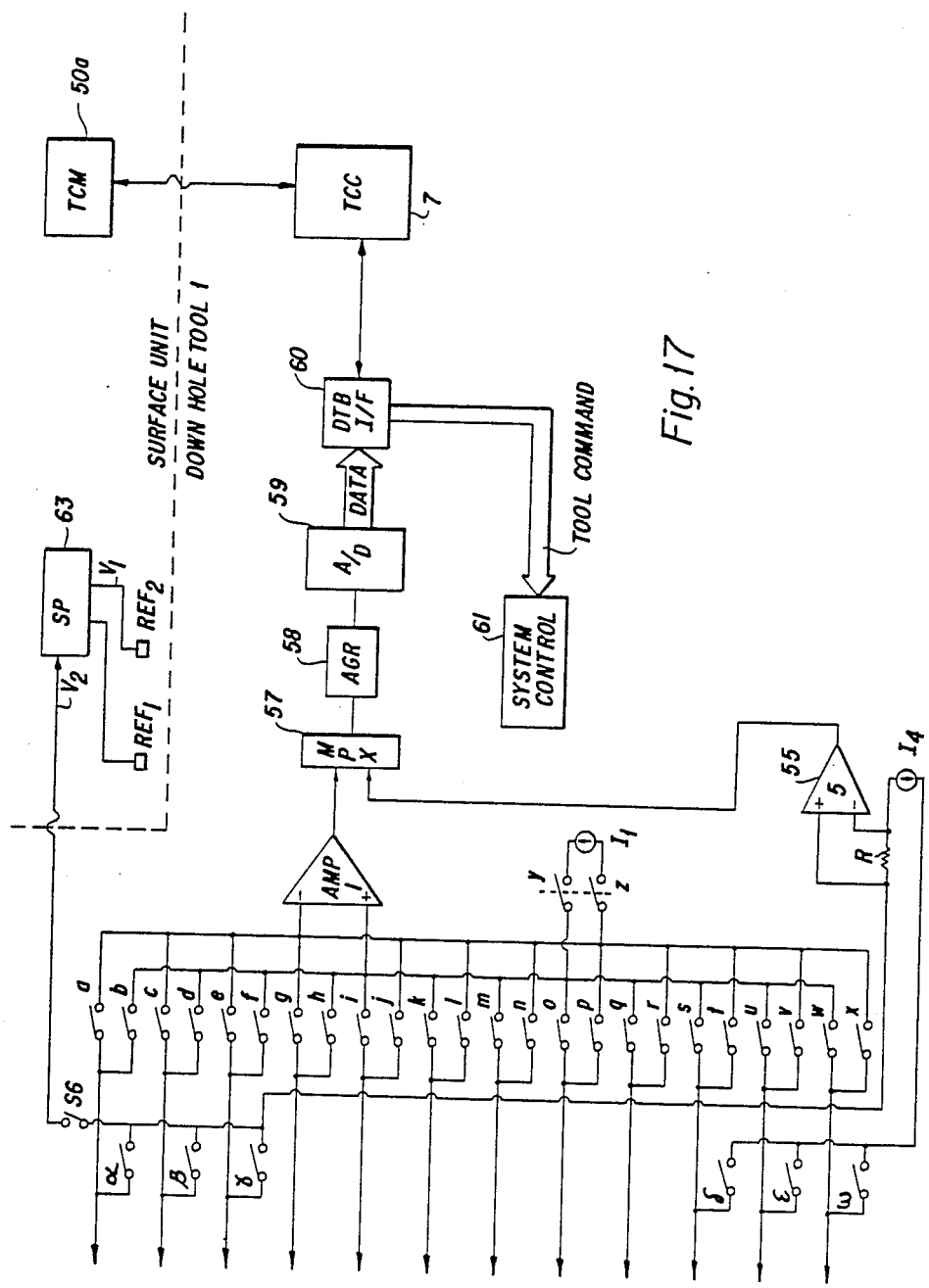
FIG. 17 is a partial block, partial circuit diagram showing an alternative embodiment of the electrical structure of the downhole apparatus.

With regard to enhanced resolution, it will be appreciated that additional detail will be available if electrodes A1, A2, and A3, and D1, D2, and D3 are electrically isolated, i.e. decoupled. Thus, as seen in FIG. 17 such an arrangement is provided. Also, in FIG. 17, the apparatus 1 is provided with a single amplifier in accord with FIGS. 10a or 10b for amplifying the obtained signals. As shown, each electrode A1, A2, A3, B1, B2, B3, C1, C2, C3, D1, D2, and D3 is connectable to the inverting or non-inverting input of amplifier AMP 1 via switches a through x, and a small current source I1 is supplied across any pair of electrodes via switches y and z, and switches a through x. As with the apparatus of FIG. 9, a larger current source I4 is also supplied. However, in the embodiment of FIG. 17, the current source I4 applied is connectable via switches alpha through omega ($\alpha - \omega$) to each of the outer electrodes A1, A2, A3, and D1, D2, and D3 such that multiple casing resistance measurements can be made. It will be appreciated that all the switches provided in FIG. 17 may be low noise mechanical relays or analog integrated circuit switches as desired, and all are controlled by software command via system control 61. It will also be appreciated with regard to FIGS. 9 and 17, that like numbers are used to identify like elements.

Figure 18A:
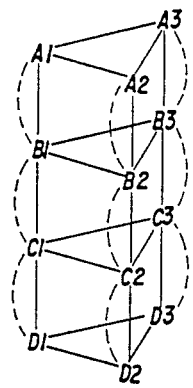
FIGS. 18a through 18f are schematic illustrations useful for showing the different measurements which may be taken by the apparatus of FIG. 17.
Figure 18B:
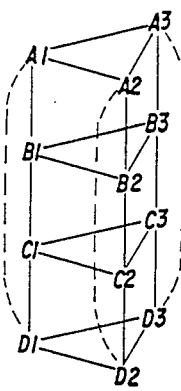
Figure 18C:
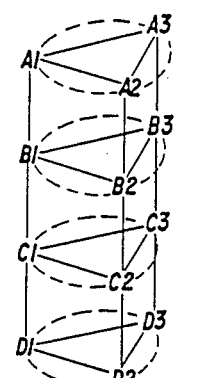

The decoupling of electrodes A1, A2, and A3, and D1, D2, and D3 permits more detailed information to be obtained, as shown in FIGS. 18a-f. Thus, for example, besides obtaining axial potential differences between electrodes B1-C1, B2-C2, and B3-C3 as shown in Step 1 of FIG. 14b, axial potential differences for A1-B1, A2-B2, A3-B3, C1-D1, C2-D2, C3-D3, as well as A1-D1, A2-D2, and A3-D3 may be obtained as shown in FIGS. 18a and 18b. Indeed, by injecting a small current into the different electrodes with the arrangements of FIGS. 18a and 18b, many additional contact resistance measurements beyond those shown in FIG. 14d may be obtained. The same reasoning applies to the circumferential potential difference and contact resistance measurements of FIGS. 14e and 14f with relation to FIG. 18c.

Figure 18D:
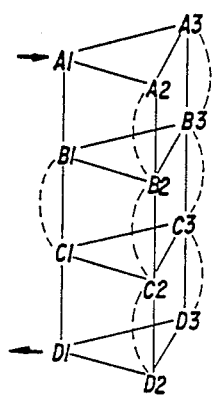
Figure 18E:
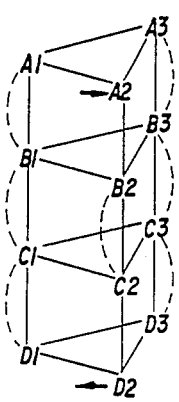
Figure 18F:
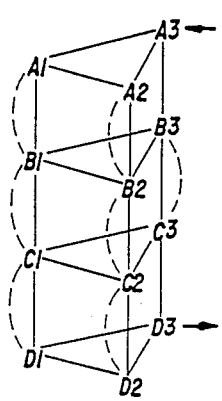

The ability to obtain additional information with the appartus arrangement of FIG. 17 is more marked with regard to the casing resistance measurements. Thus, in contrast to FIG. 14c where a single casing resistance measurement was obtained, separate currents may be applied over electrodes A1-D1, A2-D2, and A3-D3 as shown in FIGS. 18d, 18e, and 18f, with many potential difference measurements being obtained. The separate currents permit a more accurate casing resistance determination as geometrical correction factors may be derived to account for the convergence and divergence of currents to and from the point contacts. This is in contrast to the situation where the electrodes at level A are shorted together as are the electrodes at level D, and where current flow may be uneven due to poor electrode contact with the casing.

Figure 19A:
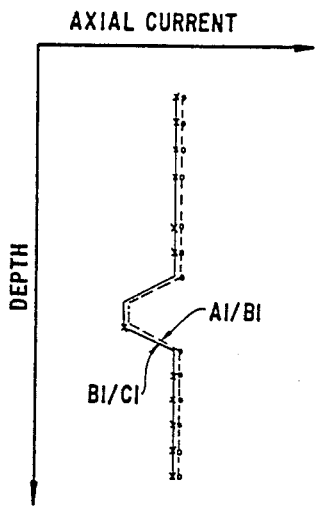
FIGS. 19a through 19d are example plots of axial current over casing depth which are useful for distinguishing between the cases of current varying with depth and current varying with time.
Figure 19B:
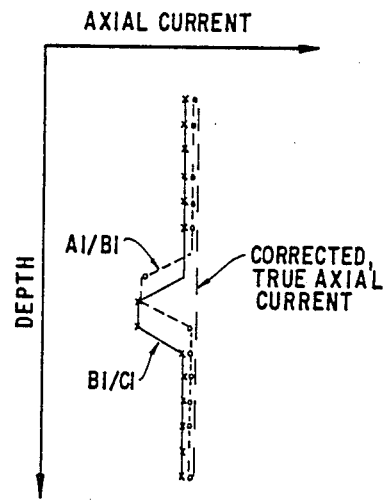

The arrangement of the apparatus as seen in FIG. 17 also provides another important advantage. Because any pair of electrodes may be connected by switches a-x, same station measurements can be made between electrode pairs of the same spacing but at different depths (e.g. pairs A1-B1, and B1-C1). The apparatus may then be moved in the casing such that the electrode pair B1-C1 is located at the depth where the pair A1-B1 had previously been (and pair C1-D1 is where B1-C1 had been). When the measured potential differences for the A1-B1 and B1-C1 pairs are plotted against depth, the two curves should overlay even though the measurements were made at different times. Thus, as seen in FIG. 19a, even where the axial current varies with depth such that a local corrosion cell is formed, the two curves should provide the same results. If the two curves do not properly overlay, such as seen in FIG. 19b, it is assumed that the electrodes were measuring a transient current such as might have been introduced by e.g. a magnetic storm, an unstable rectifier, a change in cathodic protection, or other interferences. Because both electrode pairs see the transient current simultaneously, they both provide a similar profile, albeit at different depths. Thus, a corrected axial current profile may be obtained by compensating for the time-dependent fluctuation.

Figure 19C:
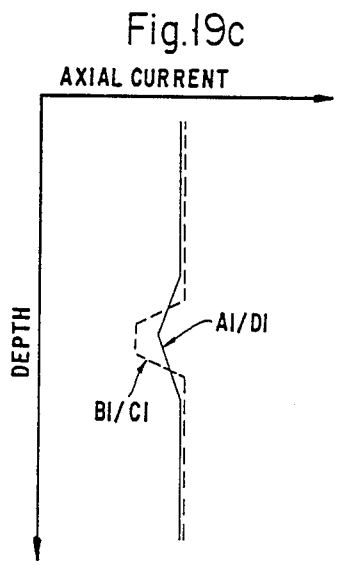
Figure 19D:
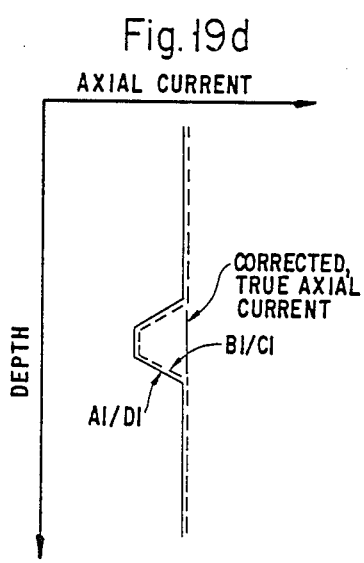

Another manner for distinguishing between axial current varying with depth and axial current varying with time would be to record the potential differences from two different electrode pairs which are centered at the same depth but which have different spacings, e.g. A1-D1, and B1-C1. As seen in FIG. 19c, where the axial current varies with depth, the longer spacing curve will spread out changes in axial current compared to the shorter spacing curve, thereby reflecting the longer sample interval. Thus, FIG. 19c is representative of a situation where axial current varies with depth. On the other hand, where current varies with time, the different electrode pairs will provide identical profiles for the same depth, as seen in FIG. 19d. Thus, where different spacings are used, the reverse situation to FIGS. 19a and 19b obtains, such that an identical profile situation suggests current varying with time which must be corrected, while differing profiles suggest current varying with depth. It will be recognized that the ability to distinguish between such currents would not be available where the tool could only provide an electrode pair over a single axial distance.

As described in detail above, and in accordance with the preferred embodiments of the present invention, when the downhole apparatus is so structured to measure a desired electrical property at the site of deployment directly, measurements can be carried out at high accuracy. Since the measurements are carried out locally and the measured results are amplified, digitized, and transmitted to a desired place through the cable, the measurements are not adversely affected by the cable no matter how long it may be. When the downhole apparatus is structured to have a plurality of electrodes arranged axially as well as circumferentially, a local two dimensional survey of the casing 3 can be carried out, thereby permitting an accurate high resolution and high speed determination of the location of possible corrosion.

Although the present invention has been described in detail above by way of particular embodiments, the present invention should not be limited only to these particular embodiments as various modifications may be made easily without departing from the spirit and technical scope of the present invention. For example, the above embodiments have been described as to the case when applied to borehole casings, but the present invention may be equally applied for diagnosing various tubular elements, such as pipes and ducts, buried or exposed. In addition, use has been made of stationary type electrodes in the above-described embodiments, but use may also be made of roller type electrodes as is well known for one skilled in the art. It should also be noted that the number of electrodes to be arranged in the axial and circumferential directions can be determined depending on the conditions of applications as desired. Further, while the distances between adjacent electrode levels was disclosed as being equal, if desired, the axial spacings may be at uneven intervals. Therefore, it will be apparent to those skilled in the art that other changes and modifications may be made to the invention wihout departing from the scope of the invention as so claimed.

We claim:

1. An apparatus for investigating an elongated casing, comprising:
    (a) a housing which is connected to a cable such that said apparatus is movable along the length of said casing;
    (b) a plurality of electrodes;
    (c) positioning means provided in said housing for positioning said plurality of electrodes in an extended position where said plurality of electrodes are in contact with said casing and in a retracted position where said plurality of electrodes are held closer to said housing and said apparatus is free to move along the length of said casing;
    (d) measuring means provided inside of said housing and electrically connected to said plurality of electrodes for measuring at least the potential difference of said casing between the locations where said plurality of electrodes are in contact with said casing, wherein the potential difference information of said casing measured by said measuring means is amplified by said measuring means, and the amplified information is transmitted through said cable for processing; and
    (e) control means provided in said housing for controlling the operation of said positioning means and said mesuring means.

2. An apparatus according to claim 1, wherein:
said measuring means includes at least one amplifier circuit having a pair of input terminals which are connectable to at least predetermined ones of said plurality of electrodes, and one output terminal.

3. An apparatus according to claim 2, wherein:
said input terminals of said at least one amplifier circuit are further connectable to a reference potential, and
said amplifier circuit includes
    a first operational amplifier with said pair of input terminals being the input terminals to said operational amplifier,
    a second input terminal, and
    a feedback loop connecting the output terminal of said first operational amplifier to said second input terminal of said first operational amplifier thereby substantially eliminating the offset voltage of said first operational amplifier.

4. An apparatus according to claim 3, wherein:
said feedback loop includes a holding means connected between said output and said second input terminal of said first operational amplifier for temporarily holding an offset voltage supplied by said first operational amplifier when said terminals of said first operational amplifier are connected to said reference voltage.

5. An apparatus according to claim 4 wherein:
said holding means includes a first capacitor.

6. An apparatus according to claim 5, wherein:
said feedback loop further includes in series from said output to said second input terminal of said first operational amplifier, a switch, a second capacitor, a second operational amplifier with the second capacitor connected to the input of said second operational amplifier, a third capacitor connected to the output of said second operational amplifier, a second switch, and a third operational amplifier, wherein said first capacitor is connected between the input into said third operational amplifier and a reference voltage.

7. An apparatus according to claim 3, wherein:
said amplifier circuit with said pair of input terminals, said second input terminal and said feedback loop is a preamplifier, and said measuring means further includes an amplifier having a first input terminal, a second input terminal, and a feedback loop, wherein the output of said preamplifier is the input into said amplifier.

8. An apparatus according to claim 2, wherein:
said amplifier circuit further includes a preamplifier having a transformer, an operational amplifier, and a switching means,
wherein said pair of input terminals connected to said electrodes are connected to the input of said transformer via switching means,
wherein the output of said transformer is connected to the input of said operational amplifier.

9. An apparatus according to claim 8, wherein:
said preamplifier further includes a first capacitor connected between the transformer output and said operational amplifier, and a second capacitor connected to the operational amplifier output, and wherein said amplifier circuit further comprises an amplifier having
a first operational amplifier with an output terminal and an input, with said output from said second capacitor of said preamplifier being the input to said operational amplifier of said amplifier,
a second input terminal into said operational amplifier of said amplifier, and
a feedback loop connecting the output terminal of said first operational amplifier of said amplifier to said second input terminal of said first operational amplifier of said amplifier, thereby substantially eliminating the offset voltage of said first operational amplifier of said amplifier.

10. An apparatus according to claim 9, wherein:
said feedback loop of said amplifier further includes in series from said output terminal of said first operational amplifier of said amplifier to said second input terminal of said first operational amplifier of said amplifier, a switch, a first capacitor, a second operational amplifier with the first capacitor connected to the input of said second operational amplifier, a second capacitor connected to the output of said second operational amplifier, a second switch, and a third operational amplifier, wherein a holding capacitor is connected between the input into said third operational amplifier and a reference voltage.

11. An apparatus according to claim 1, wherein:
said measuring means further includes an A/D converter for converting an output signal supplied from said output terminal of said first amplifier circuit into digital data before being supplied to said cable.

12. An apparatus according to claim 3, wherein:
said measuring means further includes an A/D converter for converting an output signal supplied from said output terminal of said first amplifier circuit into digital data before being supplied to said cable.

13. An apparatus according to claim 6, wherein:
said measuring means further includes an A/D converter for converting an output signal supplied from said output terminal of said first amplifier circuit into digital data before being supplied to said cable.

14. An apparatus according to claim 9, wherein:
said measuring means further includes an A/D converter for converting an output signal supplied from said output terminal of said first amplifier circuit into digital data before being supplied to said cable.

15. An apparatus according to claim 1, wherein:
said measuring means further includes at least one current source for applying a predetermined current between selected two of said plurality of electrodes.

16. An apparatus according to claim 3, wherein:
said measuring means further includes at least one current source for applying a predetermined current between selected two of said plurality of electrodes.

17. An apparatus according to claim 13, wherein:
said measuring means further includes at least one current source for applying a predetermined current between selected two of said plurality of electrodes.

18. An apparatus according to claim 14, wherein:
said measuring means further includes at least one current source for applying a predetermined current between selected two of said plurality of electrodes.

19. An apparatus according to claim 1, wherein:
said positioning means includes at least four longitudinally spaced arm assemblies mounted on said housing and actuating means for actuating said arm assemblies, and each of said arm assemblies includes at least one arm which is pivotally supported to said housing so as to take said extended and retracted positions, wherein each arm carries at least one of said plurality of electrodes.

20. An apparatus according to claim 19, wherein:
each of said arm assemblies includes at least three arms arranged at equal angular intervals around said housing.

21. An apparatus for investigating an elongated casing, comprising:
(a) a housing which is connected to a cable such that said apparatus is movable along the length of said casing;
(b) a plurality of electrodes which are mounted on said housing so as to be movable with respect thereto between an extended position and a retracted position, said plurality of electrodes including at least a first set of electrodes which are located at a first axial location of said housing as spaced apart from each other circumferentially, and a second set of electrodes, which are located at a second axial location of said housing as spaced apart from each other circumferentially;
(c) positioning means for positioning said plurality of electrodes selectively in said extended position where said plurality of electrodes are in contact with said casing and said retracted position where said plurality of electrodes are disengaged from said casing;
(d) electrical interface means connected between said plurality of electrodes and said cable; and
(e) control means for controlling the operation of said positioning means and said electrical interface means.

22. An apparatus according to claim 21, wherein:
said first and second sets of electrodes are arranged at equal angular intervals.

23. An apparatus according to claim 22, wherein:
said plurality of electrodes includes a third set of electrodes at a third axial position and spaced apart from each other circumferentially at equal angular intervals and a fourth set of electrodes at a fourth axial position and spaced apart from each other circumferentially at equal angular intervals.

24. An apparatus according to claim 23, wherein: said electrical interface means includes switch means for connecting and disconnecting said plurality of electrodes to and from said cable.

25. An apparatus according to claim 21, wherein: said electrical interface means includes a measuring unit for measuring a predetermined electrical property of said casing when said plurality of electrodes are at said extended position to be in contact with said casing.

26. An apparatus according to claim 23, wherein: said electrical interface means includes a measuring unit for measuring a predetermined electrical property of said casing when said plurality of electrodes are at said extended position to be in contact with said casing.

27. A method for investigating a casing fitted in a borehole, comprising:
 (a) locating a tool having a plurality of electrodes and suspended by a cable inside said casing;
 (b) positioning said plurality of electrodes such that said plurality of electrodes are in contact with said casing;
 (c) measuring at least the potential difference of said casing between the locations where said plurality of electrodes are in contact with said casing;
 (d) amplifying said measured potential differences; and
 (e) transmitting said amplified potential difference signals through said cable for processing.

28. A method according to claim 27, further comprising:
 (f) digitizing said amplified measured potential differences prior to said transmitting step, wherein amplified, digitized potential difference information is transmitted though said cable.

* * * * *